United States Patent
Bilal et al.

(10) Patent No.: US 10,128,439 B1
(45) Date of Patent: Nov. 13, 2018

(54) REPROGRAMMABLE PHONONIC METASURFACES

(71) Applicants: California Institute of Technology, Pasadena, CA (US); ETH Zuerich, Zurich (CH)

(72) Inventors: Osama R. Bilal, Pasadena, CA (US); Chiara Daraio, South Pasadena, CA (US); Andre Foehr, San Marino, CA (US)

(73) Assignees: CALIFORNIA INSTITUTE OF TECHNOLOGY, Pasadena, CA (US); ETH ZUERICH, Zurich (CH)

( * ) Notice: Subject to any disclaimer, the term of this patent is extended or adjusted under 35 U.S.C. 154(b) by 0 days.

(21) Appl. No.: 15/955,441

(22) Filed: Apr. 17, 2018

Related U.S. Application Data

(60) Provisional application No. 62/527,377, filed on Jun. 30, 2017, provisional application No. 62/527,661, filed on Jun. 30, 2017.

(51) Int. Cl.
*H01L 49/00* (2006.01)
*H03K 19/21* (2006.01)
*G06F 7/501* (2006.01)

(52) U.S. Cl.
CPC ......... *H01L 49/006* (2013.01); *H03K 19/215* (2013.01); *G06F 7/501* (2013.01)

(58) Field of Classification Search
CPC .............................. H01L 49/006; H03K 19/215
USPC .......................................................... 326/53
See application file for complete search history.

(56) References Cited

U.S. PATENT DOCUMENTS

| | | | | |
|---|---|---|---|---|
| 7,233,041 B2* | 6/2007 | Duan | ..................... | B82Y 10/00 257/14 |
| 2007/0194225 A1* | 8/2007 | Zorn | ..................... | B82Y 35/00 250/306 |
| 2009/0322221 A1* | 12/2009 | Makansi | ................. | F25B 21/00 313/523 |
| 2014/0054652 A1* | 2/2014 | Abe | ...................... | H01L 29/772 257/254 |
| 2015/0377648 A1* | 12/2015 | Sirohiwala | ............. | G01D 5/145 324/207.2 |
| 2016/0351807 A1* | 12/2016 | Scheibner | ............. | H01L 29/872 |

OTHER PUBLICATIONS

Abraira, Victoria, et al., "The Sensory Neurons of Touch." *Neuron* 79, 618-639, (Aug. 2013). 22 pages.

Anikeeva, P., et al., " Restoring the sense of touch." *Science* 350(6258), 274-275, (Oct. 2015). 3 pages.

Babaee, S., et al., "Harnessing Deformation to Switch On and Off the Propagation of Sound." *Advanced Materials* 28(8), 1631-1635, (Dec. 2015). 20 pages.

(Continued)

*Primary Examiner* — Dylan White
(74) *Attorney, Agent, or Firm* — Steinfl + Bruno LLP

(57) ABSTRACT

A phononic transistor can be realized by arranging a row of cantilevered structures with attached magnets, elastically extending upward upon application of a magnetic repulsive force to the magnets. In the extended configuration, the phonons are transmitted from source to drain, while in the flattened configuration the phonons are blocked from transmission. A gate element controls the ON and OFF states of the phononic transistor.

14 Claims, 37 Drawing Sheets

(56) References Cited

OTHER PUBLICATIONS

Bilal, O.R., et al., "Bistable metamaterial for switching and cascading elastic vibrations." *PNAS* 114(18), 4603-4606, (Apr. 17, 2017, published online before print). 9 pages.
Bilal, O.R., et al., "Reprogrammable Phononic Metasurfaces." *Advanced Materials*, 29(39), (Aug. 25, 2017, published online before print). 29 pages.
Bilal, O. R.,et al, "Trampoline metamaterial: Local resonance enhancement by springboards." *Applied Physics Letters* 103(11), 111901, (Sep. 2013). 4 pages.
Bilal, O.R., et al., "Ultrawide phononic band gap for combined inplane and out-of-plane waves." *Physical Review E* 84, 065701(R), (Dec. 2011). 4 pages.
Boechler, N., et al., "Bifurcation-based acoustic switching and rectification." *Nature Materials* 10(9), 665-668, (Sep. 2011). 4 pages.
Bringuier, S., et al., "Phase-controlling phononic crystals: Realization of acoustic Boolean logic gates." *The Journal of the Acoustical Society of America* 130(4), 1919-1925, (Oct. 2011). 7 pages.
Chortos, A., et al., "Pursuing prosthetic electronic skin." *Nature Materials* 15(9), 937-950, (Jul. 4, 2016). 14 pages.
Cummer, S. A., et al., "Controlling sound with acoustic metamaterials." *Nature Reviews Materials* 1, 16001, (Feb. 16 2016). 13 pages.
Devaux, T., et al., "Asymmetric acoustic propagation of wave packets via the self-demodulation effect." *Physical Review Letters* 115(23), 234301, (Dec. 2015). 5 pages.
Foehr, et al., "Spiral-based phononic plates: From wave beaming to topological insulators." *Physics Review Letters* 120, 205501, (May 2018). 9 pages.
Freeth, T., et al., "Decoding the ancient Greek astronomical calculator known as the Antikythera Mechanism." *Nature* 444(7119), 587-591, (Nov. 2006). 5 pages.
Hatanaka, D., et al., "A phonon transistor in an electromechanical resonator array." *Applied Physics Letters* 102(21), 213102, (May 2013). 4 pages.
Hussein, M. I., et al., "Dynamics of Phononic Materials and Structures: Historical Origins, Recent Progress, and Future Outlook." *Applied Mechanics Reviews* 66(4), 040802, (May 2014). 52 pages.
Jing, H., et al., "PT-Symmetric Phonon Laser." *Physical Review Letters* 113(5), 053604, (Jul. 2014). 8 pages.
Joulain, K., et al., "Quantum Thermal Transistor." *Physical Review Letters* 116(20), 200601, (May 20, 2016). 5 pages.
Ladd, T.D., et al., "Quantum computers." *Nature* 464(7285), 45-53, (Mar. 2010). 9 pages.
Liang, B., et al., "Acoustic Diode: Rectification of Acoustic Energy Flux in One-Dimensional Systems." *Physical Review Letters* 103(10), 104301, (Sep. 2009). 4 pages.
Liang, B., et al., "An acoustic rectifier." *Nature Materials* 9(12), 989-992, (Dec. 2010). 4 pages.
Liang, B., et al., "Acoustic transistor: Amplification and switch of sound by sound." *Applied Physics Letters* 105(8), 083510, (Aug. 2014). 5 pages.
Li, F., et al., "Granular acoustic switches and logic elements." *Nature Communications* 5, 5311, (Oct. 2014). 6 pages.
Li, B., et al., "Negative differential thermal resistance and thermal transistor." *Applied Physics Letters* 88(14), 143501, (Apr. 2006). 4 pages.
Li, X. F., et al., "Tunable Unidirectional Sound Propagation through a Sonic-Crystal-Based Acoustic Diode." *Physical Review Letters* 106(8), 084301, (Feb. 2011). 4 pages.
Liu, Z., et al., "Locally Resonant Sonic Materials." *Science* 289(5485), 1734-1736, (Sep. 2000). 4 pages.
Mahboob, I., et al., "Interconnect-free parallel logic circuits in a single mechanical resonator." *Nature Communications* 2, 198, (Feb. 2011). 7 pages.
Maldovan, M., "Sound and heat revolutions in phononics." *Nature* 503(7475), 209-217, (Nov. 2013). 9 pages.
Malishava, M., et al., "All-phononic Digital Transistor on the Basis of Gap-Soliton Dynamics in an Anharmonic Oscillator Ladder." *Physical Review Letters* 115(10),104301, (Sep. 2015). 7 pages.
Menabrea, L., "Sketch of the Analytical Engine Invented by Charles Babbage, with notes by the translator Augusta Ada King, Countess of Lovelace." *Taylors Scientific Memoirs* 3, 666-731, (1843).
Nghiem, B. T., et al., "Providing a Sense of Touch to Prosthetic Hands." *Plastic and Reconstructive Surgery* 135(6), 1652-1663, (Jun. 2015). 16 pages.
Popa, B.-I., et al., "Non-reciprocal and highly nonlinear active acoustic metamaterials." *Nature Communications* 5, 3398, (Feb. 2014). 5 pages.
Saal, H. P., et al., "Biomimetic approaches to bionic touch through a peripheral nerve interface." *Neuropsychologia*, 79, 344-353, (Dec. 2015). 10 pages.
Sklan, S. R., "Splash, pop, sizzle: Information processing with phononic computing." *AIP Advances* 5(5), 053302, (Apr. 2015). 30 pages.
Vahala, K., et al., "A phonon laser." *Nature Physics* 5(9), 682-686, (Aug. 2009). 5 pages.
Wang, L., et al., "Thermal Logic Gates: Computation with phonons." *Physical Review Letters* 99(17), 177208, (Oct. 2007). 5 pages.
Wijk, U., et al., "Forearm amputees' views of prosthesis use and sensory feedback." *Journal of Hand Therapy* 28(3), 269-278, (Jul. 2015). 11 pages.
Zhang, T., et al., "Acoustic logic gates and Boolean operation based on self-collimating acoustic beams." *Applied Physics Letters* 106(11), 113503, (Mar. 2015). 6 pages.

* cited by examiner

REPROGRAMMABLE PHONONIC METASURFACES

CROSS REFERENCE TO RELATED APPLICATIONS

The present application claims priority to U.S. Provisional Patent Application No. 62/527,377, filed on Jun. 30, 2017, and U.S. Provisional Patent Application No. 62/527,661, filed on Jun. 30, 2017, the disclosure of both being incorporated herein by reference in its entirety.

TECHNICAL FIELD

The present disclosure relates to acoustic devices. More particularly, it relates to reprogrammable phononic metasurfaces.

SUMMARY

In a first aspect of the disclosure, a structure is described, the structure comprising a first substrate comprising a first plurality of magnets arranged in a first row, and a first gate magnet on a first lateral side of the first substrate; a second substrate comprising a plurality of cantilevered elements and a second plurality of magnets, each cantilevered element of the plurality of cantilevered elements comprising a magnet of the second plurality of magnets and at least one cantilever, the plurality of cantilevered elements and the second plurality of magnets being arranged in a second row; and a control element comprising a first flexible substrate and a second gate magnet attached to the at least one flexible substrate; wherein: the first flexible substrate of the control element is positioned so that the second gate magnet is in an offset position relative to the first gate magnet, upon transmission of a phonon to first flexible substrate of the control element, the first flexible substrate moves from the offset position to an aligned position aligning the second gate magnet to the first gate magnet, the aligned position of the first flexible substrate is configured so that a first repulsive magnetic force is applied between the second gate magnet and the first gate magnet, upon application of the first repulsive magnetic force, the first substrate shifts from a first position offset from the second substrate to a second position vertically aligned to the second substrate, the second position is configured so that a second repulsive magnetic force is applied between each magnet of the first plurality of magnets arranged in the first row, and each corresponding magnet of the second plurality of magnets arranged in the second row, and upon application of the second repulsive force, each cantilevered element of the plurality of cantilevered elements extends elastically upward from a flattened configuration.

In a second aspect of the disclosure, a system is described, the system comprising a plurality of phononic transistors, each phononic transistor comprising the structure of the first aspect, the plurality of phononic transistors configured to form at least one phononic logic gate.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Figure 1:
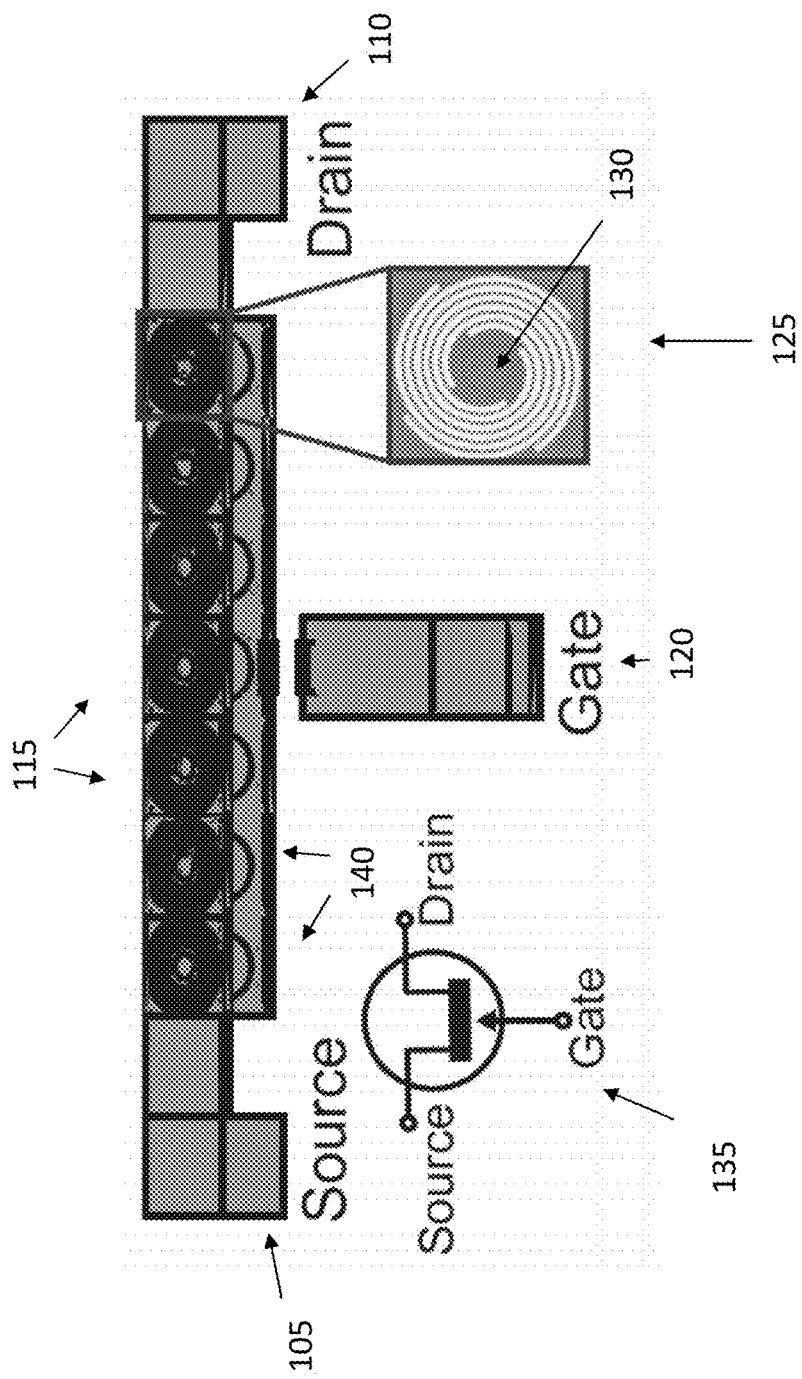
FIG. 1 illustrates an exemplary phononic device.

The present disclosure describes the realization of phononic transistors and similar devices capable of manipulating phonons with phonons. As known to the person of ordinary skill in the art, phonons are elastic vibrations in a periodic lattice of a material. Phonons are described in quantum mechanics as quasiparticles and represent excited and quantized states in the modes of vibrations of elastic structures of a material. The present disclosure describes, in some embodiments, a transistor-like device, controlled by magnetic coupling, that can gate, switch and cascade phonons without resorting to frequency conversion. The present disclosure also demonstrates all logic operations for information processing. One advantage described in the present disclosure is that the system described herein operates at a single frequency. The present disclosure also describes the experimental realization of a phonon-based mechanical calculator.

The present disclosure describes bistable metamaterials for switching and cascading elastic vibrations. The realization of acoustic devices analogous to electronic systems, like diodes, transistors and logic elements, suggest the potential use of elastic vibrations (i.e., phonons) in information processing, for example, in advanced computational systems, smart actuators and programmable materials. Previous experimental realizations of acoustic diodes and mechanical switches have employed nonlinearities to break transmission symmetry. However, existing solutions require operation at different frequencies or involve signal conversion in the electronic or optical domains. The present disclosure describes the experimental realization of a phononic transistor-like device employing geometric nonlinearities to switch and amplify elastic vibrations, via magnetic coupling, operating at a single frequency. By cascading this device in a tunable mechanical circuit board, it is possible to realize the complete set of mechanical logic elements. These logic elements can be interconnected to execute calculations.

As known to the person of ordinary skill in the art, the idea of realizing a mechanical computer has a long-established history. The first known calculators and computers were both mechanical, as in Charles Babbage's concept of programmable computer and Ada Lovelace's first description of programming. However, the discovery of electronic transistors rapidly replaced the idea of mechanical computing. Phononic metamaterials, used to control the propagation of lattice vibration, are systems composed of basic building blocks, (i.e., unit cells) that repeat spatially. These materials exhibit distinct frequency characteristics, such as band gaps, where elastic or acoustic waves are prohibited from propagation. Potential applications of phononic metamaterials in computing can range from thermal computing (at small scales) to ultrasound and acoustic based computing (at larger scales). Phononic devices analogous to electronic or optical systems have already been demonstrated. For example, acoustic switches, rectifiers, diodes and lasers have been demonstrated both numerically and experimentally. Recently, phononic computing has been suggested as a possible strategy to augment electronic and optical computers or even facilitate phononic-based quantum computing. All-phononic circuits have been theoretically proposed, and phononic metamaterials have been identified as tools to perform basic logic operations. Electromechanical logic and transistors operating using multiple frequencies have also been demonstrated. Most of these devices operate using electronic signals or operate at mixed frequencies. When different frequencies are needed for information to propagate, it becomes difficult, if not impossible, to connect multiple devices in a circuit.

Electronic transistors used in today's electronic devices are characterized by their ability to switch and amplify electronic signals. Conventional field effect transistors (FET) consist of at least three terminals: a source, a drain and a gate. The switching functionality takes place by applying a small current at the gate to control the flow of electrons from the source to the drain. Due to the big difference between the low amplitude controlling signal (in the gate) and the higher amplitude controlled signal (flowing from the source to the drain), it is possible to cascade an electronic signal by connecting multiple transistors in-series to perform computations. The present disclosure describes the realization of a phononic transistor-like device, that can switch and amplify vibrations with vibrations (operating exclusively in the phononic domain).

In some embodiments, a phononic device as described herein utilizes elastic vibrations at a gating terminal to control transmission of elastic waves between a source and a gate, operating at a single frequency. For example, in some embodiments, a frequency $f_0=70$ Hz can be used. However, the person of ordinary skill in the art will understand that, in other embodiments, other frequencies may be used. In some embodiments, a phononic device consists of a one-dimensional array of geometrically nonlinear unit cells (representing the metamaterial), connecting the source to the drain.

FIG. 1 illustrates an exemplary device, comprising a source (105), a drain (110), and a gate (120). An exemplary electronic circuit symbol is illustrated (135). The device comprises, for example, a plurality of spiral spring structures (115). In FIG. 1, seven such structures are illustrated, with a detailed view of one of them (125). For example, the spring comprises a magnetic mass (130) in the middle, which can respond to magnetic fields. Upon the application of a magnetic field, the spiral spring can extend vertically. For example, the spiral spring may be fabricated by cutting or etching a material to define arcs separated from adjacent arcs, in such a way that the structure can expand vertically while exhibiting an elastic force to return into the prior flattened shape. Upon removal of the applied magnetic field, the elastic force brings the structure back into the at-rest state. The spiral shape of FIG. 1 is exemplary, and different shapes, such as different types of spiral shapes, may be used when fabricating the springs.

Figure 2:
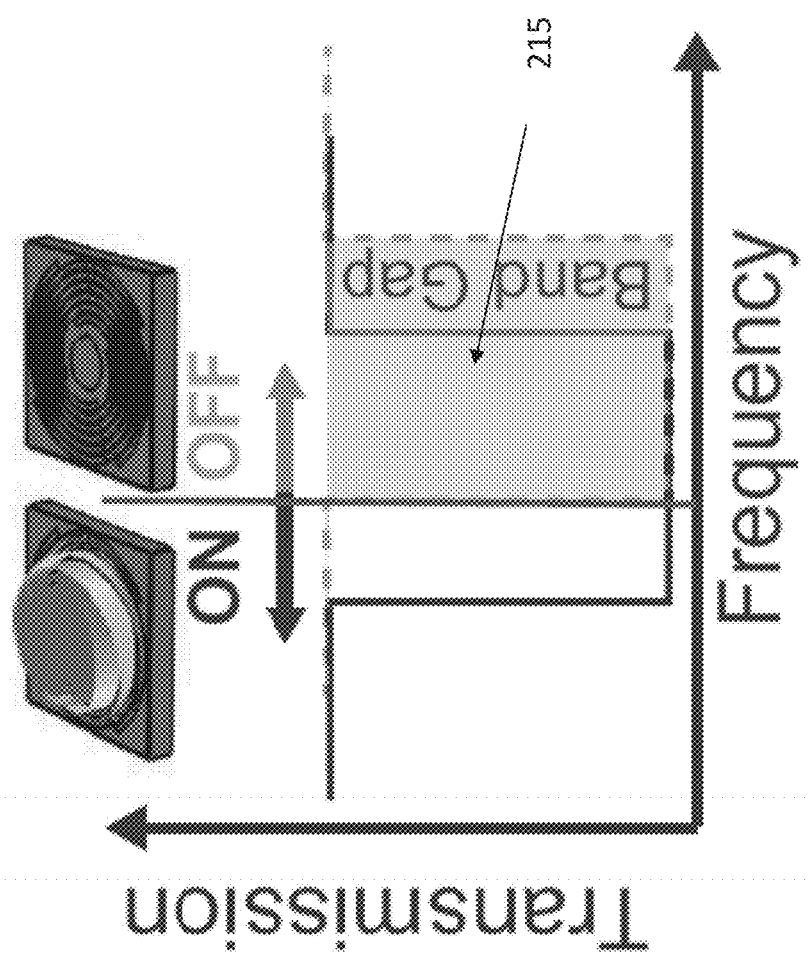
FIG. 2 illustrates a band gap in an exemplary phononic device.

In the example of FIG. 1, each unit cell is composed of a spiral-spring containing a magnetic mass at its center. The magnetic mass allows the stiffness of the spiral-spring to be tuned by an external magnetic field. The metamaterial is designed to support a resonant, sub-wavelength band gap, whose band edges vary with the stiffness of the spiral-springs, as illustrated in FIG. 2. FIG. 2 illustrates a conceptual visualization of the switching principle: as the unit cell-shapes change, the transmission spectrum of the signal through the metamaterial shifts between ON/OFF states. The shaded area (215) highlights the band gap in the OFF configuration.

Figure 3:
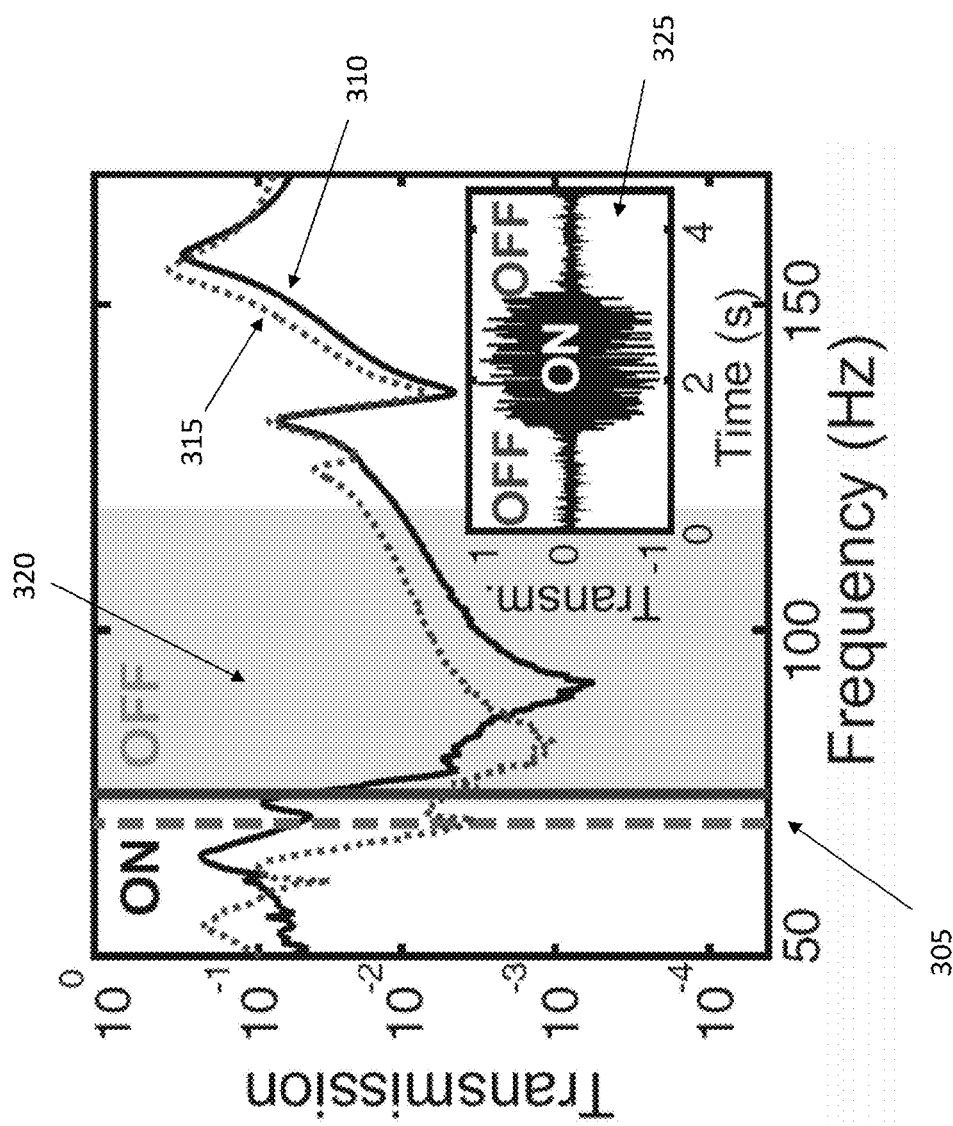
FIG. 3 illustrates an exemplary transmission spectrum.

To tune the mechanical response of the metamaterial, it is possible place an array of permanent magnets under the unit cells, for example under the seven cells in FIG. 1 (140). In some embodiments, the permanent magnets are coupled to a driven, magnetic cantilever, which can be referred to as the "gate" in the present disclosure. The gate, in the example used to illustrate an exemplary device, is designed to resonate at a frequency $f_0=70$ Hz. When the gate is excited by a relatively small mechanical signal, the resonance of the cantilever shifts the array of magnets and tunes the transmission spectrum of the metamaterial. An exemplary transmission spectrum is illustrated in FIG. 3. FIG. 3 illustrates the experimental transmission spectrum of the transistor in the ON (310) and OFF states (315). The inset (325) shows a time series of the mechanical signal at the operational frequency marked by the dashed line at value (305).

The energy potential of the gating system is bistable and provides control of the transmission of a signal from the source to the drain. It is possible to characterize the transistor-like device experimentally by fixing one end of the metamaterial structure to the source (e.g. a mechanical shaker) and the other end to the drain (e.g. a fixed, rigid support). The signal at the drain can be measured using a laser Doppler vibrometer. The operation frequency of the transistor is indicated by the dashed line in FIG. 3 (305). The gate tunes the transmission signal from the source to the drain, acting as a switch for a harmonic, elastic wave with frequency $f_0$. In FIG. 3, the continuous line (310) represents a 0 state, while the dashed line represents a 1 state. The shaded region (320) is the band gap obtained from the numerical analysis of the infinite periodic medium theory. The ratio between transmission coefficients in the ON and OFF states is 12.5 in the example of FIG. 3. While most transistors retain asymmetric transmission, there exist transistor models, e.g., junction field effect transistors (JFET), that require a choice on which terminal to assign to a drain and source (i.e., the transistor is symmetric with respect to transmission from the source and drain). If an asymmetric transmission is required, a defect can be incorporated into the metamaterial array. However, if a defect is introduced a possible drawback could be losing the operation at a unified single frequency, because of the nonlinear mode conversion.

Figure 4:
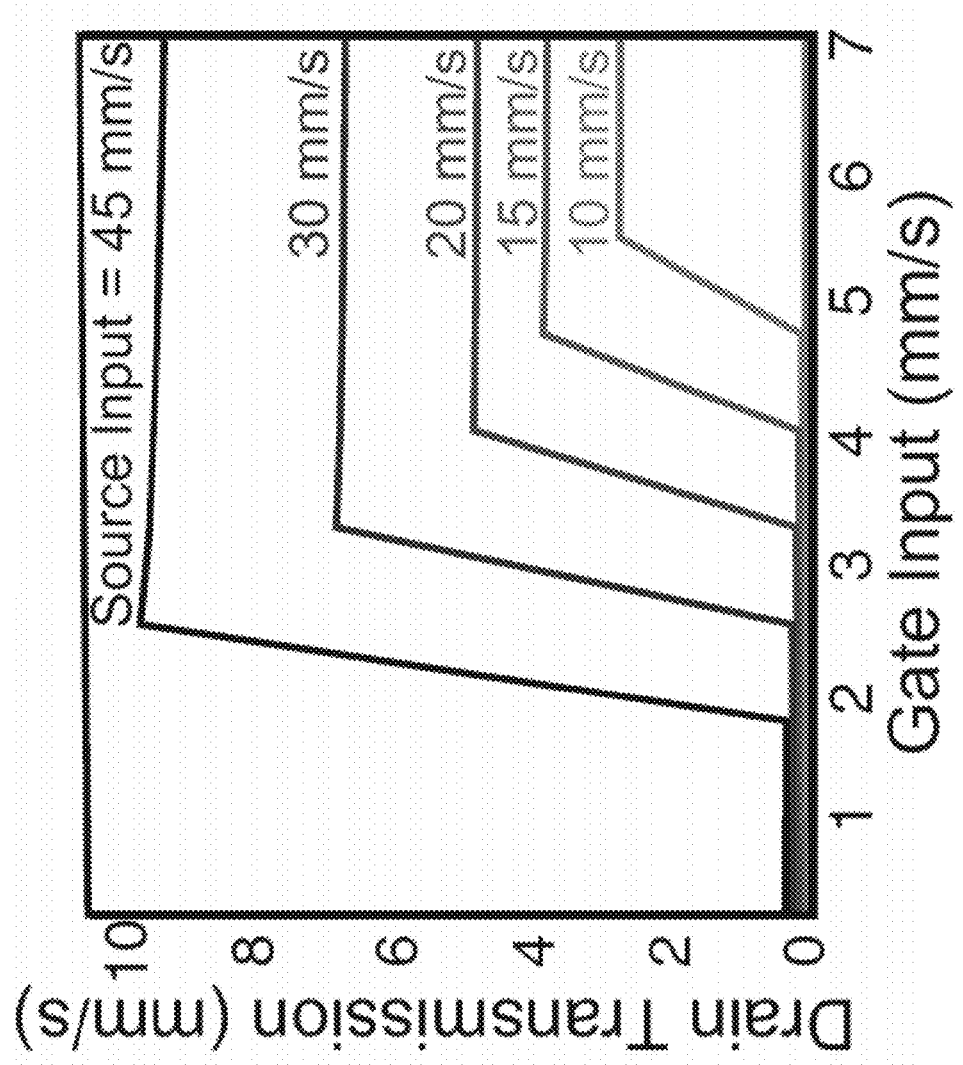
FIG. 4 illustrates exemplary transmission at the drain as a function of gate input.
Figure 5:
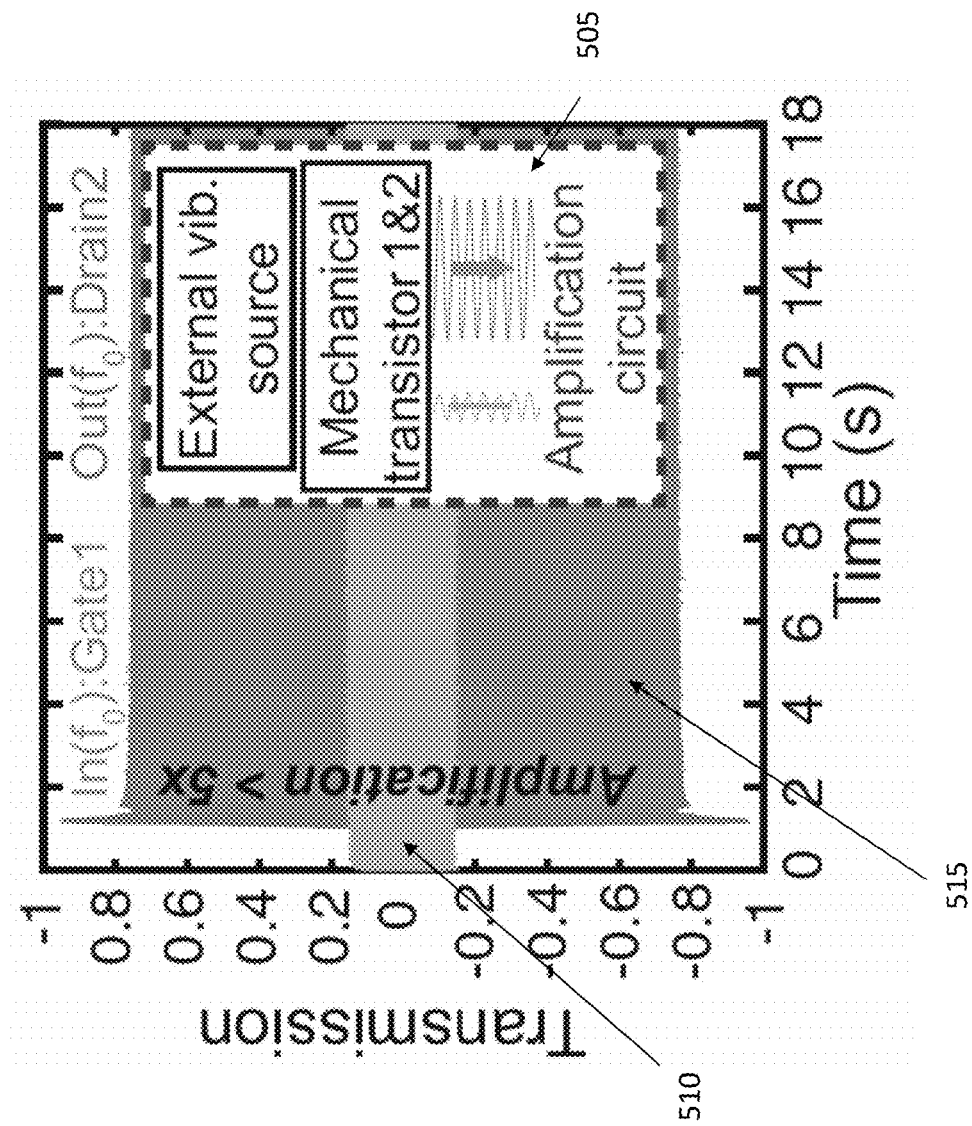
FIG. 5 illustrates an experimental time series of an exemplary phononic amplifier.

To demonstrate the switching functionality of the transistor, it is possible to measure the transmission at the drain as a function of gate input, as illustrated in FIG. 4. FIG. 4 illustrates a phononic transistor as a switch, with experimental measurements of the transmission at the drain as a function of gate input, for different source input. As the vibration amplitude at the source is increased, an increase in the efficiency of the transistor as a switch can be observed. For instance, when the source input is relatively small, e.g., the velocity amplitude of the driving signal is set to 15 mm/s, the gate can be opened (switching the system ON) with a gate excitation of 5 mm/s, with a source-to-gate input ratio equal 3. If the source input is larger, e.g., 45 mm/s, a smaller excitation of the gate, 3 mm/s, is sufficient to switch the system ON, with a source-to-gate input ratio of 15. Stronger source signals translate to larger displacements of the metamaterials that, in turn, affect the coupling strength between the array of control-magnets and the magnets in the metamaterial. The strengthening of this coupling leads to an increase in efficiency in the gating functionality, defined as source-to-gate input, by at least a factor of 5 in the exemplary configurations tested experimentally.

Figure 6:
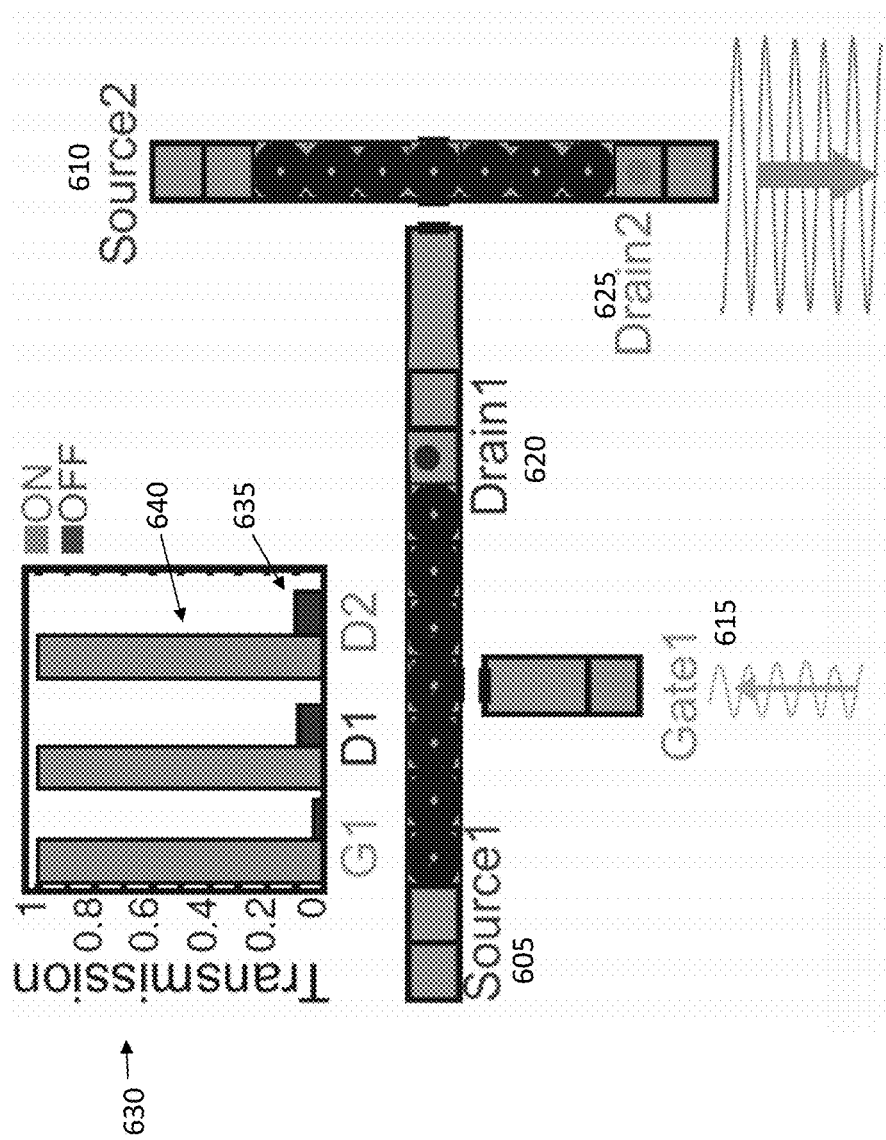
FIG. 6 illustrates a phononic transistor as an amplifier.

To demonstrate signal cascading, two transistors can be connected in a mechanical circuit, as illustrated in FIG. 6. FIG. 6 illustrates a phononic transistor as an amplifier with two connected transistors. During the experiments, the sources of both transistors, sources 1 (605) and source 2 (610) are always turned ON, and the transmission at gate 1 (615), drain 1 (620) and drain 2 (625) are measured with a laser vibrometer. The inset of FIG. 6 (630) illustrates the relative measured signal amplitudes when gate$_1$ is OFF (635) and ON (640). The signal is normalized at both drain terminals to its maximum amplitude of transmission, to visualize the difference between the ON and OFF states. The leakage at the two drain terminals is less than 10% of the transmission amplitude when the gate is closed. This value is close to the background noise level captured by the laser vibrometer in absence of excitation. To show the cascading effect between the two transistors, it is possible to consider the time signal of gate 1 as the circuit input and the measured signal at drain 2 as the circuit output. Once gate 1 is open, both drain 1 and 2 gain transmission, with a delay of less than one second. The two signals (drain 2 output)/(gate 1 input) demonstrate an amplification factor bigger than 5. This value can be increased by changing the excitation amplitude of source 2. Experimental time series of the signal measured at gate$_1$ and drain$_2$. The inset (505) shows the circuit in analogy to electronics. The lighter shaded area (510) illustrates the signal at gate 1 of FIG. 6, while the darker shaded area (515) illustrates the signal at drain 2 in FIG. 6.

Figure 7:
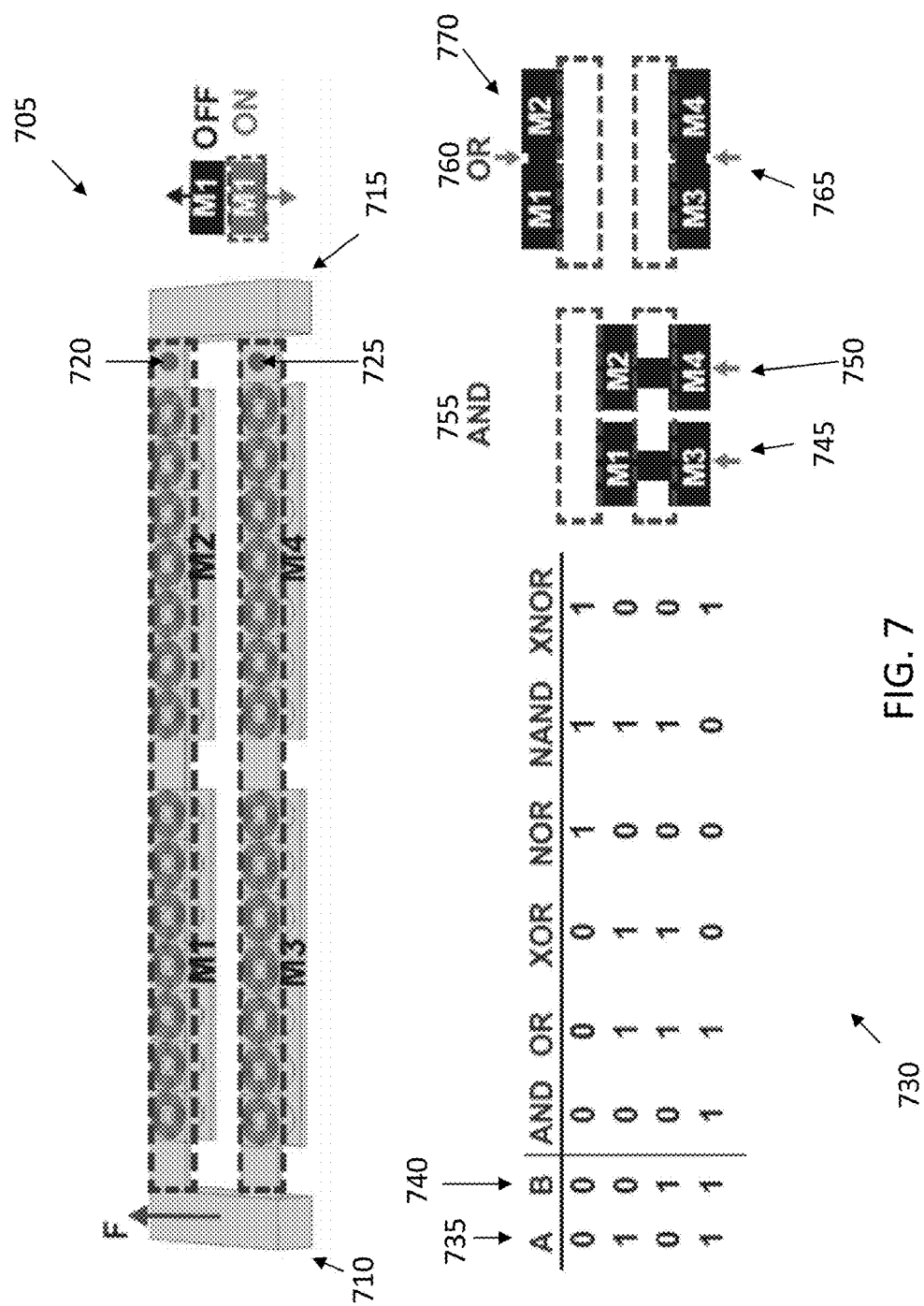
FIG. 7 illustrates exemplary gates.

Modern electronic devices employ connected stacks of switches to perform logic operations. For example, in an AND logic operation, when two switches are connected in series, no signal passes through unless both switches are open. In other words, the output of the circuit is 1 (true) when both inputs are 1 (true) and 0 (false) otherwise. If two switches are connected in parallel, when either one of them is open (true), the circuits produces an output signal (true). This circuit represents an OR gate. Following the same approach, it is possible to create all the basic electronic logic gates using switches as basic building blocks. In the present disclosure, it is possible to utilize a configuration of four interconnected switches to experimentally realize phononic logic gates analogous to all existing electronic ones. This configuration can be referred to as the universal phononic logic gate (UPLG), as illustrated in FIG. 7 (705). One terminal (710) of the UPLG can be connected to a vibration source that excites harmonic elastic waves. The signal transmitted to the other terminal (715) is measured in the location indicated by the circles (720,725). To implement all the logic operations, the coupling between the magnetic control stages ($M_i$, with i=1, . . . , 4) for each gate is controlled in a systematic manner (730).

Figure 8:
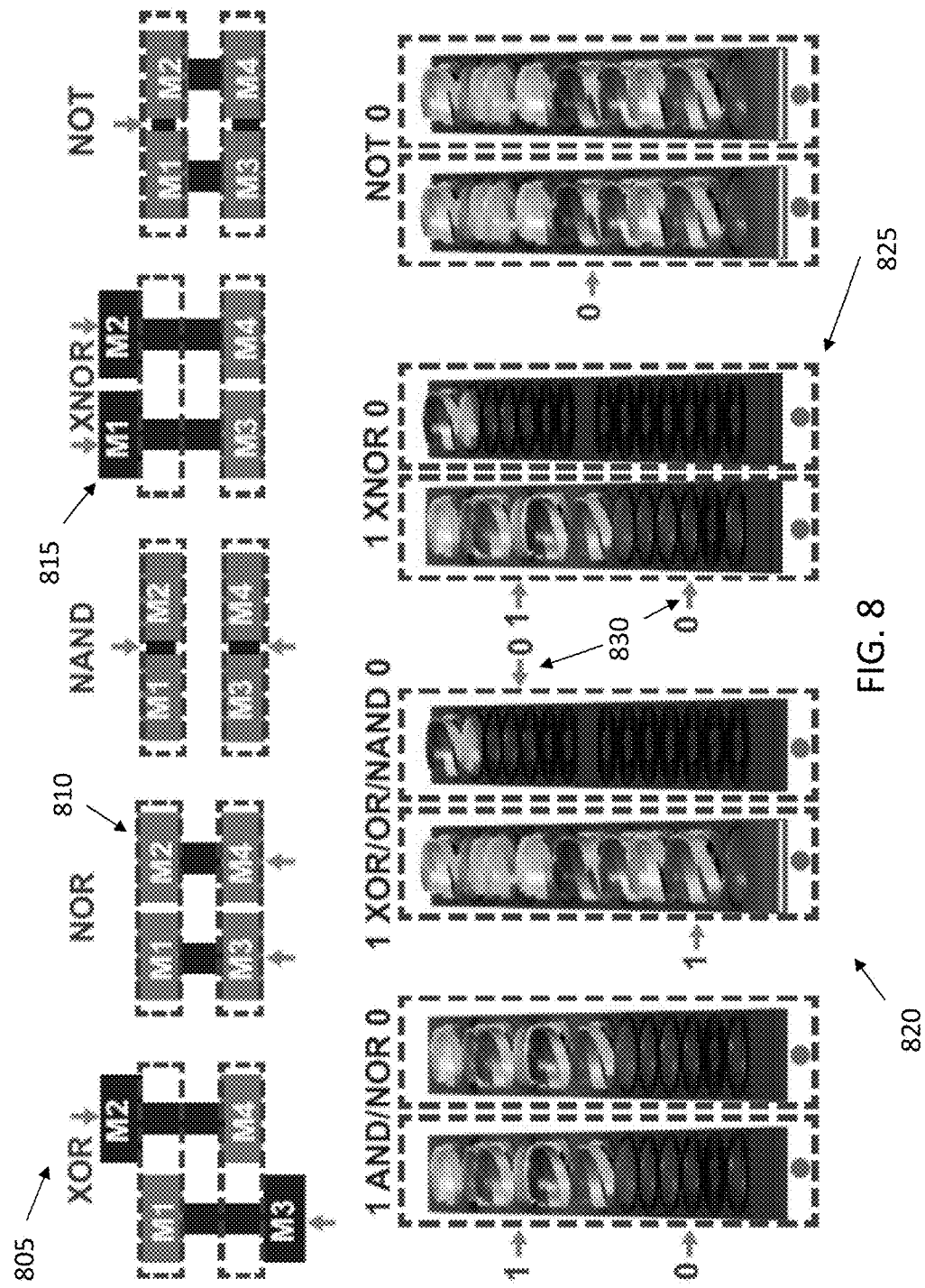
FIG. 8 illustrates simulations corresponding to the gates of FIG. 7.

For instance, to have an AND gate, it is possible to connect $M_1$ and $M_3$ (745) into one magnetic stage that could be driven by a magnetic cantilever as a single control unit, representing a binary state A (735). Stages $M_2$ and $M_4$ (750) are coupled in a similar manner representing another binary state, B (740). The position of the magnetic stages, resembling the AND gate functionality (755), represents the logic operation 0 AND 0 resulting in 0 (i.e., all switches are black/OFF). Other exemplary gates are illustrated in FIGS. 7-8. For example, the OR gate (760) comprises couplings (770) and (765), while other gates are illustrated in (805). In FIG. 8, the ON switches are shaded in a lighter gray (810), while the OFF switches are shaded in a darker gray (815).

For example, for the XNOR gate, both pairs $M_{1,3}$ and $M_{2,4}$ are coupled, but with a different coupling distance than the AND gate. The XNOR represents the operation 0 XNOR 0 which results in 1 (two ON switches along the same transmission line). The numerical simulations of the operations 1 UPLG 0 (820) agree with the corresponding experimental measurements illustrated in FIG. 9. In the experiments, the output is measured at the two end points of the UPLG, to characterize each transmission line and define the output of the gate as the summation of the two signals. The logical 1 is defined as signals with a transmission amplitude bigger than ⅔ of the maximum signal transmitted through 14 resonators—one line of resonators in FIG. 7 (705). The logical 0 is defined as signals less than ⅓ of that maximum. For example, for the logic operation 1 OR 0 (905) one transmission line is open (910) while the other is closed (915). In this case, about 10% transmission leakage is measured from the ON to the OFF state.

Figure 9:
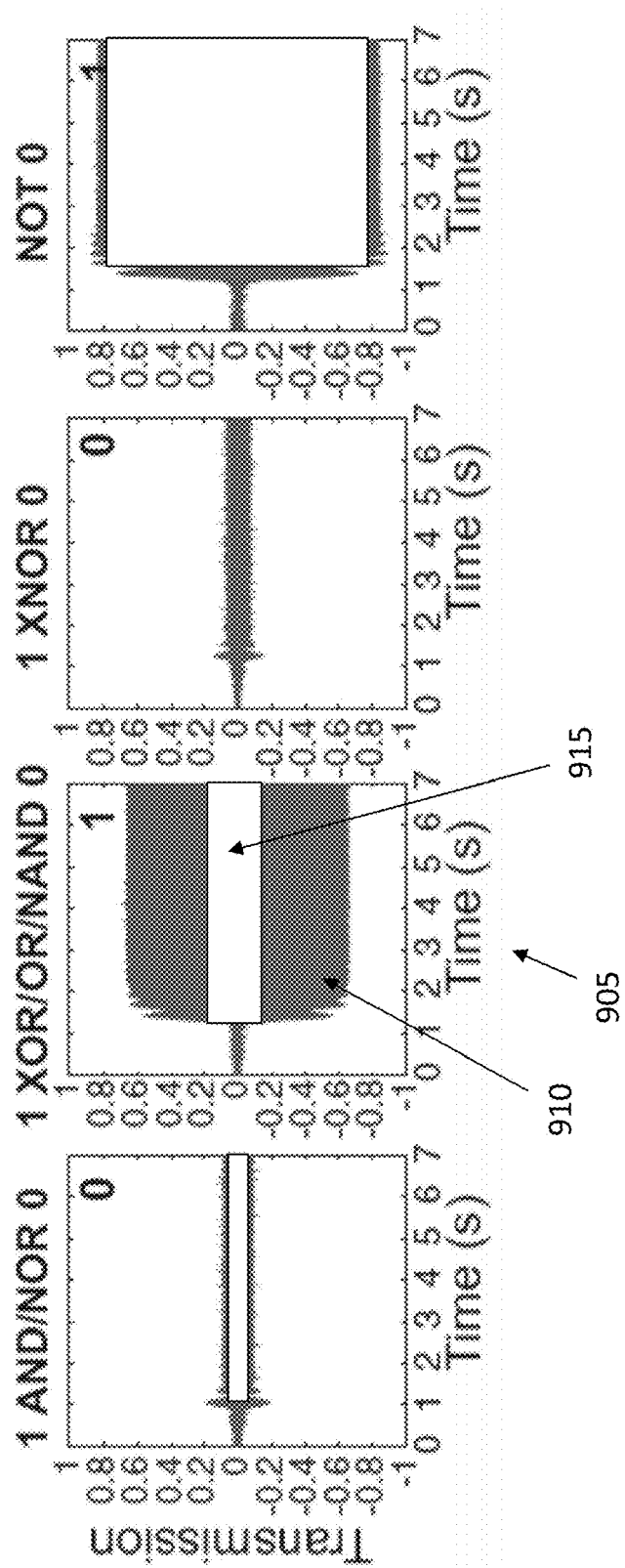
FIG. 9 illustrates exemplary measurements corresponding to the gates of FIGS. 7-8.

FIG. 7 (705) illustrates a schematic of 4-interconnected switches. FIG. 7 (730) and FIG. 8 (805) illustrate a schematic of the relative positions of the magnetic stages in reference to the metamaterial for the logic gates representing the first row in the table (A=0 and B=0). The NOT gate operates on a single input (A=0). FIG. 8 (820) illustrates numerical simulations of the different logic gates representing the second row in the table in FIG. 7. FIG. 9 illustrates experimental time series for different gates, dark and unshaded regions correlate with each left or right side of the simulations illustrated in FIG. 8. The dotted lines such as (825) are the reference frames for the magnetic control stages $M_{1-4}$. The ON and OFF states represent the position of the stage, relative to the metamaterial. The magnetic stage is either underneath the spiral-springs (ON) or displaced laterally by 6 mm (OFF). The arrows in FIGS. 7-8 such as (830) represent the logical inputs A and B. The vibration source powering the logic gates with the harmonic excitation F, is always on in this example.

Figure 10:
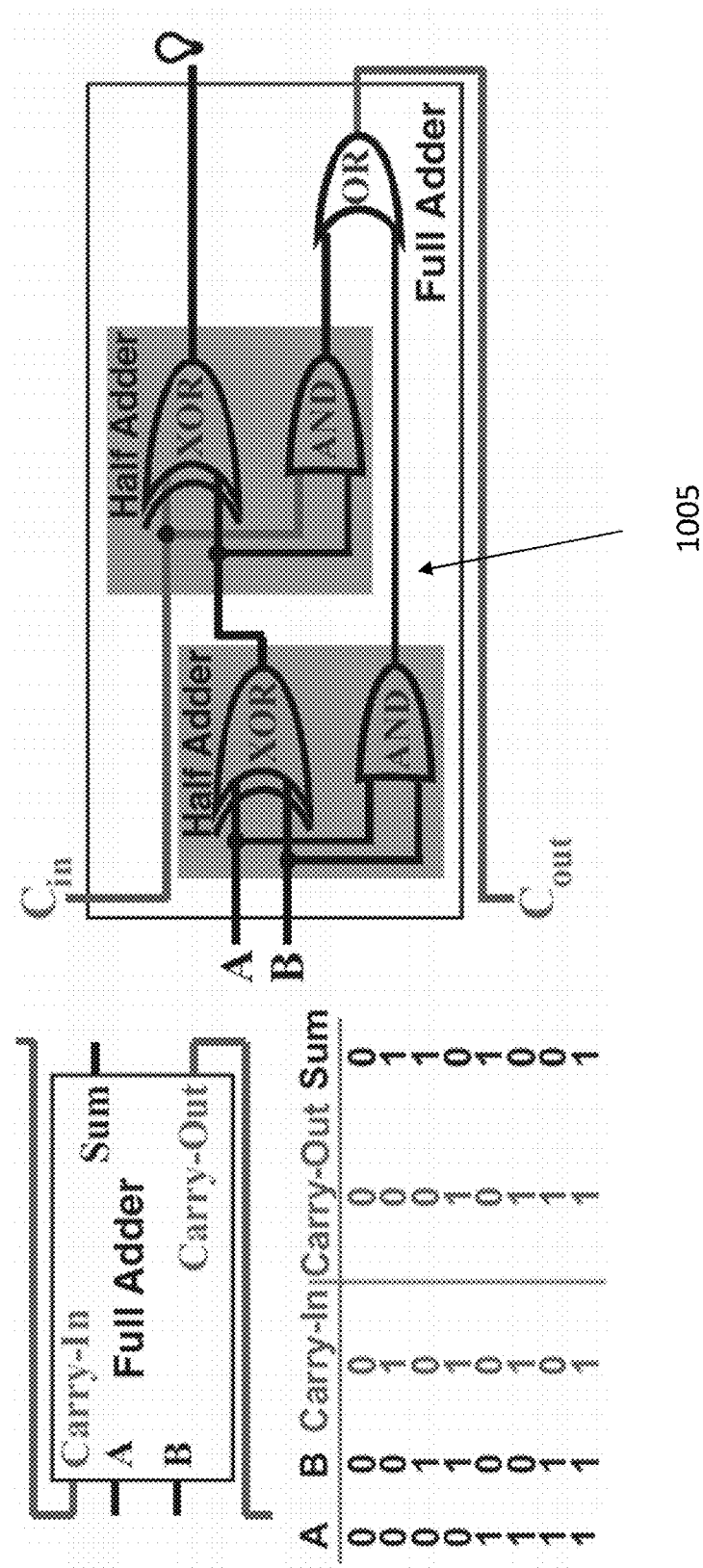
FIGS. 10-11 illustrate the implementation of a full adder.
Figure 11:
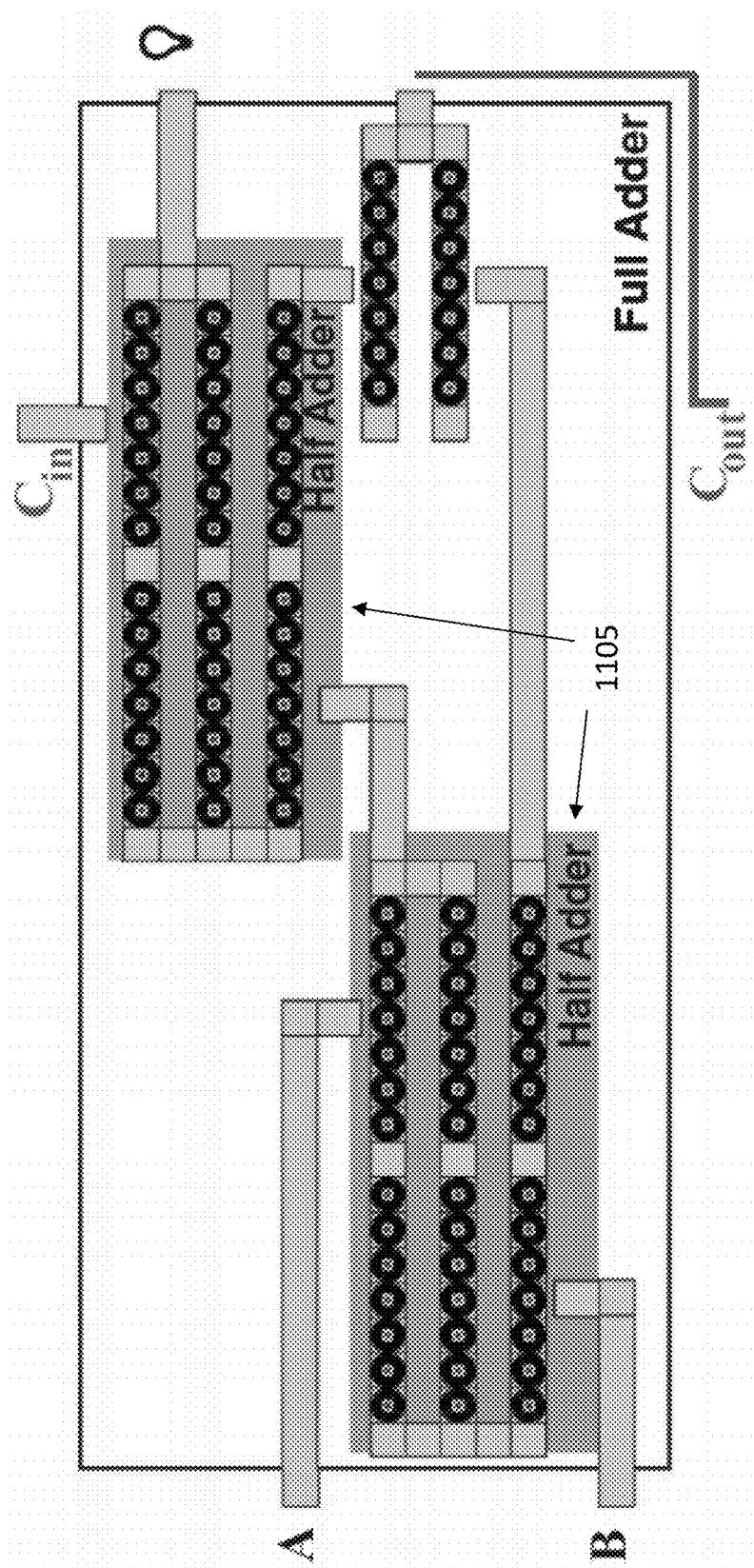
Figure 12:
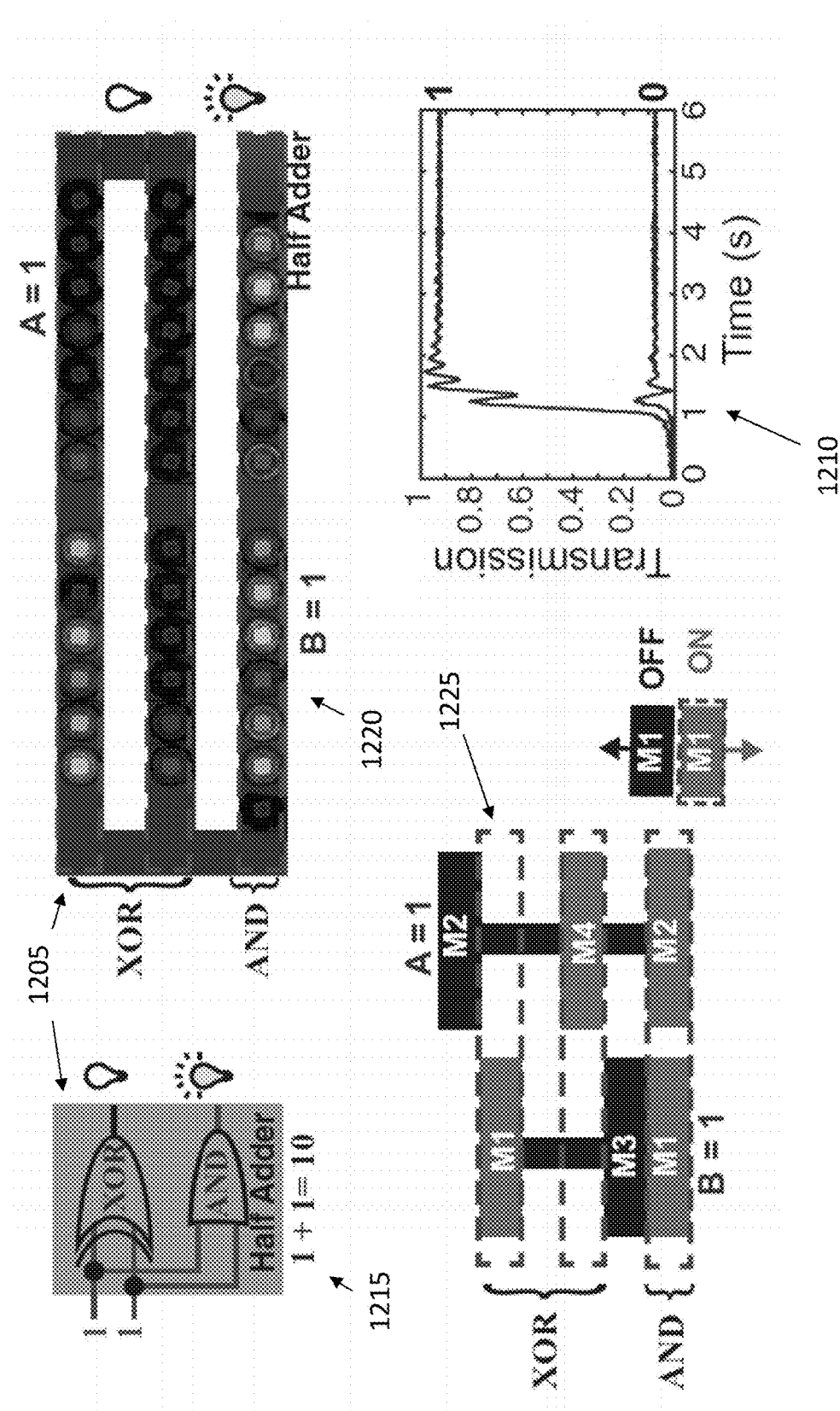
FIG. 12 illustrates the implementation of a half adder.

The realization of all logic gates is the basis for performing computations in various devices. In a binary calculator for example, the addition operation is executed in the calculator-circuit-board by a group of contiguous full adders, as illustrated in FIG. 10. The number of binary bits a calculator can add is equivalent to the number of full adders it contains. Each of these adders can be split into two half-adders, each composed of an interconnected XOR and AND gates (1005). The circuit board for a mechanical full-adder composed of two half-adders, as illustrated in FIG. 11 (1105) is similar to an electronic calculator, in which the two half-adders are linked together by an OR gate. It is possible to experimentally construct the phononic-circuit-board for a simple binary calculator. It is also possible, without any loss of generality, to demonstrate the calculator carrying out the operation 1+1. In order to add two bits, only a single half-adder is needed, as illustrated in FIG. 12 (1205)—there is no carry-in from any previous operation. The experimentally obtained time-series envelope of the operation 1+1 is illustrated in (1210). FIG. 12 (1215) illustrates the mechanical signal as it propagates in the circuit, while the attenuated signal is plotted as exiting the XOR gate. The difference between the transmitted (at the AND gate) versus the attenuated signal is more than one order of magnitude, drawing a distinct line between the 0 and 1. The finite element mode shapes (1220) of the same operation agree with the measured transmission pathway. The realization of a circuit board for a full-fledged mechanical calculator (addition, subtraction, multiplication and division) using the same design principle can easily follow. Although the proof-of-principle experiments were performed at the macroscopic scale, the planar geometry of our devices makes them scalable to microscales or nanoscales. Miniaturization of the concept would allow the realization of devices that operate at higher frequency ranges and speeds. For instance, if the unit cell size is scaled to 25 microns, dimension easily achievable with conventional microfabrication tools, the device will operate in the ultrasonic frequency range ~70 kHz. The speed of switching will scale by a power of four (mass scales approx O(3) and the distance scales linearly). This translates to a possible switching speed much higher than the frequency of operation. FIG. 12 also illustrates a schematic of the relative position of the magnetic stages to the metamaterials (1225).

The present disclosure describes a conceptual design of a dynamically tunable phononic switch and provides an experimental realization for its functionality. The connection of multiple elements in a circuit allows it to perform computing operations. This provides the first experimental demonstration of switching and cascading of phonons at a single frequency, and serves as the basis for mechanical information processing, which can have impact in soft robotics, programmable materials and advanced acoustic devices. For small scales, different tuning forces can be exploited such as electrostatic interactions.

In some embodiments, for the experimental realization of the phononic transistor-like device, the tunable metamaterial, connecting source and drain, was fabricated from medium density fiberboard (MDF), using a laser cutter. The mechanical properties of the MDF were characterized using a standard tensile test. The measured Young's modulus is 3 GPa and the density is 816 Kg/m$^3$. The quality factor of the metamaterial is ≈20. The unit cells in the metamaterial consist of 4 concentric and equally spaced Archimedean spirals, with lattice spacing of 25 mm. Cylindrical neodymium-nickel-plated magnets, with a 3 mm diameter and a 3 mm thickness, were embedded in the center of each unit cell. An array of control magnets with a 20 mm diameter and 5 mm thickness was placed on a movable stage below the array of unit cells. To control the movable stage, this was coupled to a vibrating cantilever (the gate) attached to a separate vibration source. The gate is a rectangular cantilever of dimensions 125 mm×15 mm, connected to the drain (right end) of the metamaterial. The gate-control magnets attached to the side of the control stage are square, with 10 mm side-length and 3 mm thickness, while the ones attached to the cantilever are rectangular with 6 mm×4 mm×2 mm dimensions. The person of ordinary skill in the art will understand that the above parameters are exemplary, and different materials or different dimensions may be chosen to fabricate the devices of the present disclosure. For example, instead of MDF, other possible materials may be metal, wood, polymers, or other materials. Different materials may also be used for the magnets.

Mechanical oscillations in the source terminal were excited using a shaker with two identical audio amplifiers, and were then optically detected at the drain by a laser Doppler vibrometer. A lock-in amplifier was used to filter the signal. The frequency response functions plotted in FIG. 3 are the displacement amplitude at the output (drain) normalized to the signal at the input (source). The time series in FIGS. 3, 4, 5, 9 and 12 (1210) were obtained using an oscilloscope. The time signals are filtered using a passband filter between 50 to 90 Hz. The excitation amplitude at the source is 15 mm/s. All the numerical simulations are done in COMSOL™ 5.1 using the structural mechanics module.

Figure 13:
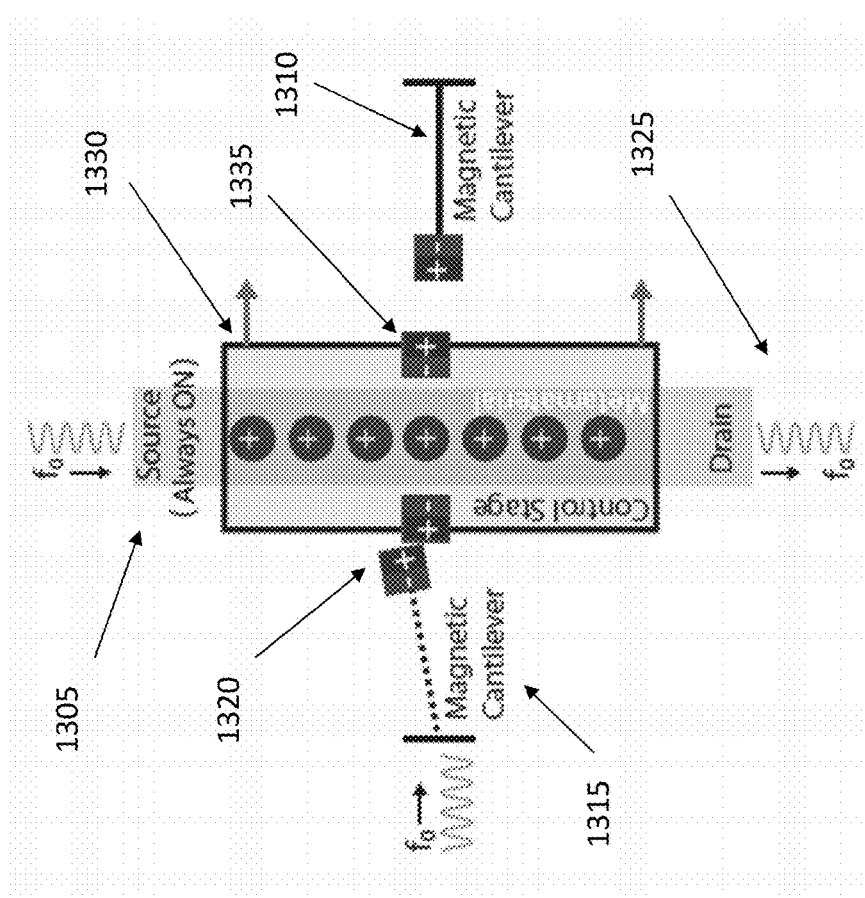
FIG. 13 illustrates a top view of an exemplary phononic transistor.

In some embodiments, a phononic transistor can be represented by the schematic diagram as in FIG. 13. A metamaterial, for example consisting of an array of 7 spiral-spring resonators with embedded magnets, connects the source (1305, e.g., a mechanical shaker) to the drain (1325). A control stage, which contains 7 magnets corresponding to the number of unit cells in the metamaterial, is positioned 7 mm below the metamaterial. The control stage also contains two other magnets, one on each side (1335, left and right in the schematic diagram), which couple to two magnetic, resonant cantilevers (1315, 1310).

The ON/OFF switching occurs when a low amplitude mechanical signal of frequency ($f_0$) excites the magnetic cantilever on either side of the control stage, causing it to resonate. This resonance disturbs the energy potential of the control stage due to its magnetic coupling with the cantilever and induces a shift of the control stage from left to right. When the stage moves, the magnetic field between the control stage magnets and the metamaterial magnets causes a shape change in the spiral-spring geometry from a flat (2D) shape to a helical (3D) shape. The shape-change, in turn, shifts the band gap frequency. This allows a mechanical signal with the same frequency ($f_0$) and higher amplitude, to flow from the source to the drain through the metamaterial.

The gate cantilevers are, in the rest state, offset, or misaligned (1320), with respect to the corresponding magnet in the control stage. When the gate is activated, one of the gate cantilevers oscillates. In the oscillation, the magnet aligns with the corresponding magnet in the control stage, generating a magnetic repulsion (the same polarities are adjacent). The magnetic repulsion moves the control stage (1330). The control stage comprises a series of magnets corresponding to the position of the magnets in the spirals. The controlling magnets are located at a distance under the spiral magnets. The control stage therefore has 2 positions: in the OFF position the two series of magnets, below and above, are not aligned; in the ON position the two series of magnets reach a vertical alignment. The magnetic repulsion along the vertical direction pushes the magnets, and the attached spiral, upward. For example, the magnetic stage is either underneath the spiral-springs (ON) or displaced laterally by 6 mm (OFF), in some embodiments. The modification in the spiral's shape, from flattened to vertically extended, in turn changes the resonant behavior of the device. The phonons from the source to the drains are not allowed through when the control stage is in the OFF position and the spirals are flattened.

Figure 14:
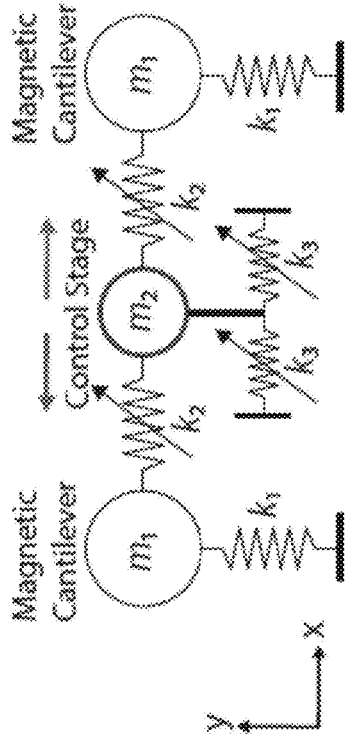
FIGS. 14-16 illustrate a circuit and data for the transistor of FIG. 13.
Figure 14:
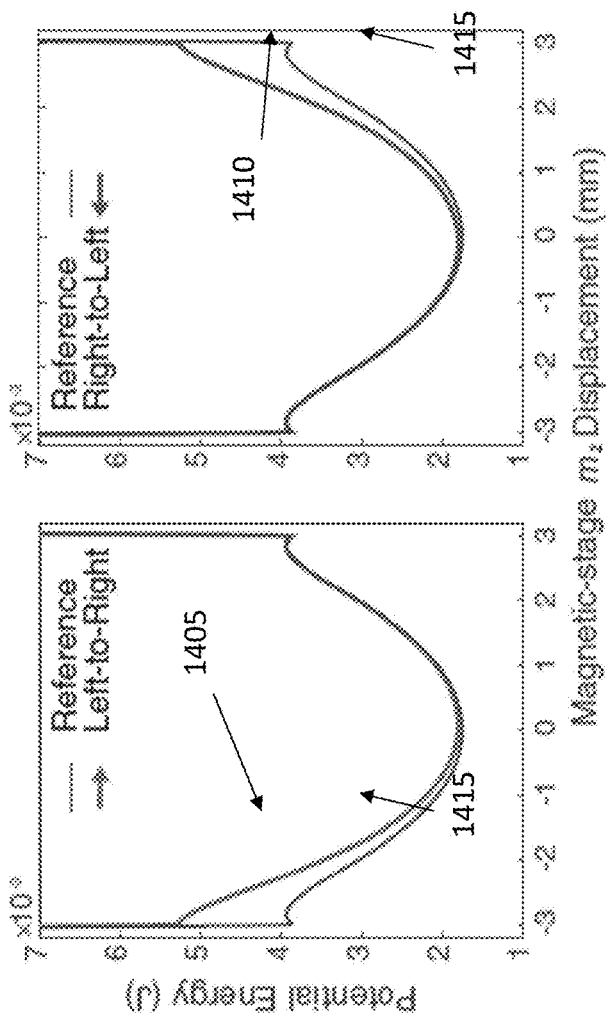

When the control stage is in the ON position and the spirals are extended, the phonons are allowed to pass from the source to the drain. Therefore, the gate controls whether the phonons at the operating frequency can go from the source to the drain. The material chosen, as well as the shape of the spiral, and the dimensions of the device, control the frequency of operation for the phonons. Other shapes may also be used instead of a spiral, such as standard cantilevers or rectangular shapes, as the principle of operation depends on the capacity of the shape to oscillate. The change in operating frequency is controlled according to the standard formula, at least in the $1^{st}$ order, where the frequency is proportional to the square root of the ratio of the mechanical stiffness constant k to the mass of the cantilever. Additionally, the number of resonant modes in a specific frequency range can also be controlled by varying the shape of the spiral. FIG. 14 illustrates an equivalent circuit for the device of FIG. 13, as well as related numerical data.

The system in FIG. 13 can be described analytically with a discrete mass-spring model. It can be assumed that the two cantilevers are identical, having a stiffness $k_1$ and mass $m_1$. Each cantilever is coupled with the control stage by a magnet, which is represented by a nonlinear spring with stiffness $k_2$. The control stage has a mass $m_2$ and has two hard-end stops represented by the nonlinear spring $k_3$ in both direction (FIG. 14). The side-to-side distance between the two resting positions of the control stage is 6 mm, which is the required displacement to switch transistor ON and OFF.

FIG. 14 illustrates a schematic of the dynamically bistable switching mechanism approximated into masses and springs. The energy potential of the control stage when it moved from one of its hard end stops ($k_3$) to the other end, as in lines (1405) and (1410). The line (1415) represents the equilibrium state of the control stage when at equal distance from the magnetic cantilevers.

The forces acting on the control stage are only emerging from the magnetic cantilevers ($k_2$) and the end stops of the stage ($k_3$). Their potential can be approximated as:

$$V_{Tot}=V_S(x-x_{end})+V_S(-x-x_{end})+\int(F_{Mag}(r_{S,L},P_L,p_S)+F_{Mag}(r_{S,R},p_R,p_S))\partial x,$$

where $V_S$ represents the displacement of the control stage, with $x_{end}$=3 mm. The magnetic potential is obtained by integrating $F_{Mag}$ over $\partial x$, p is the polarization vector and $r_{i,j}$ is the vector connecting the two magnets i and j. The hard end-stops are represented by the nonlinear springs $k_3$ that are one sided:

$$V_S(\Delta x) = \frac{1}{2}k[\Delta x]_+^2.$$

The magnetic dipole-dipole interaction force is calculated as:

$$F_{Mag}(r, p_L, p_S) := \frac{3\mu_0}{4\pi\|r\|^5}\left((r\times p_L)\times p_S + (r\times p_S)\times p_L - 2r(p_L\cdot p_S) + 5\frac{r}{\|r\|^2}((r\times p_L)\cdot(r\times p_S))\right),$$

where $\mu_0$ is the magnetic permeability constant. An approximation of the magnetic polarizations $p_L$, $p_R$ and $p_S$ can be obtained using the forces for the magnets employed in the device, using $F_{Mag}$ for touching magnets. The vectors $r_{S,L}$ and $r_{S,R}$ connect the stage to the cantilever magnets.

$p_L=p_R=[2.24\times10^{-2},0,0]^T Am^2$, $p_S=[-8.22\times10^{-2},0,0]^T Am^2$, $r_{S,L}=[-x_{0,mags}-x,d_0+d_{p_L},0]^T m$, and $r_{S,R}=[-x_{0,mags}-x,d_0+d_{p_R},0]^T m$, where $x_{0,mags}=x_{end}+1.7\times10^{-3}$, and $d_0=1.5\times10^{-3}m$, are the x and y components of the equilibrium position of the cantilever magnets relative to the centered stage. The parameters $d_{p_L}$ and $d_{p_R}$ represent the deflection of the gate (i.e., of the cantilever) having a spring ($k_1$). For a given deflection of the left or right-hand-side magnets that happens as a result of the harmonic excitation at the gate in the physical system, the potential becomes asymmetric and unstable, which induces a shift in the control stage position. The energy potential of the control stage when it is exactly in the center between the two cantilevers is defined as the reference (i.e., equilibrium) state. The potential of the control stage moving from left-to-right or from right-to-left is plotted against the reference case in FIG. 14. The amount of energy required to switch a single transistor from one state to the other is estimated to be ≈70 μJ, corresponding to required shift to modify the energy potential.

Figure 15:
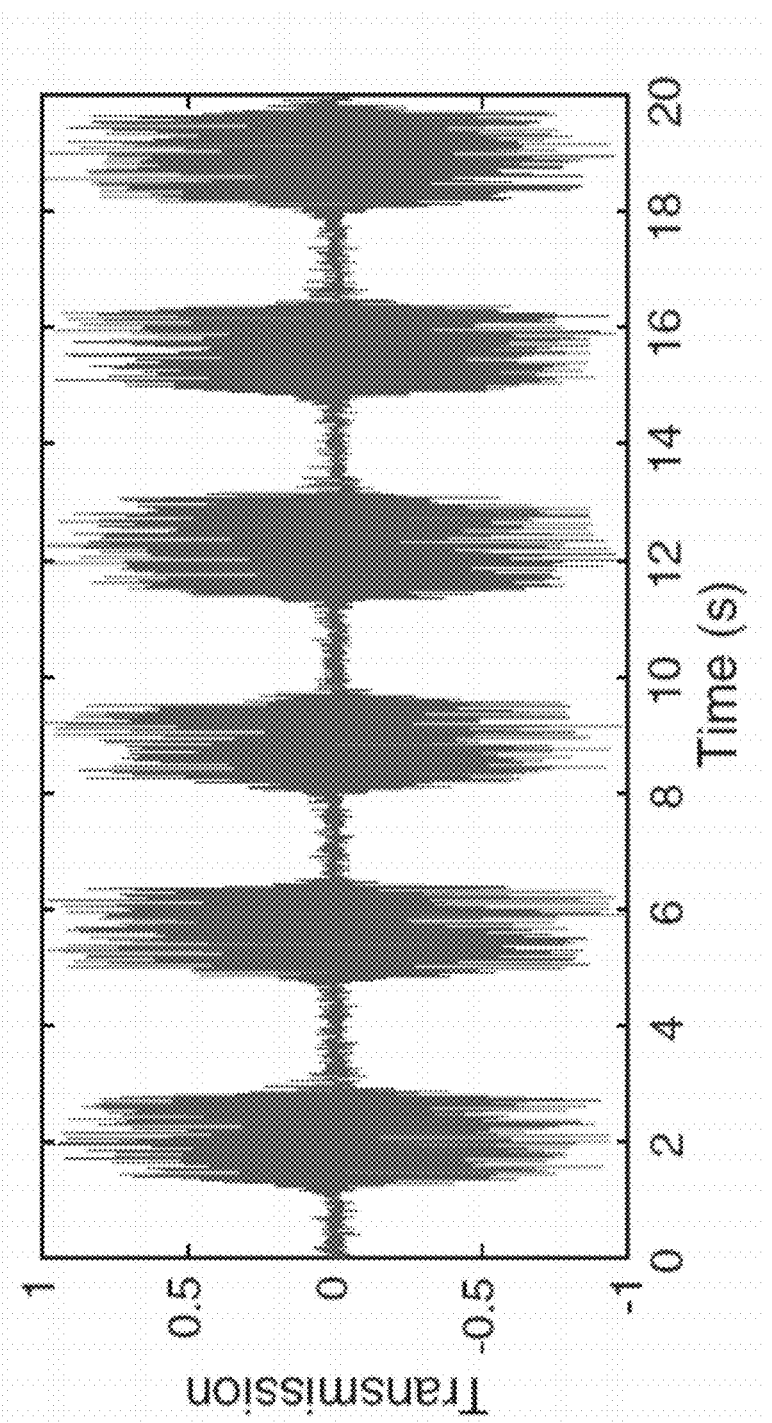

To demonstrate the stability of the proposed concept, the measured output signal in a NOT gate to alternating inputs of ones and zeros is illustrated in FIG. 15. The output signal is consistent between multiple cycles. FIG. 15 illustrates the experimental time signal acquired for a NOT gate with 12 cycles of alternating input starting with a logical 1 at time t=0.

Figure 16:
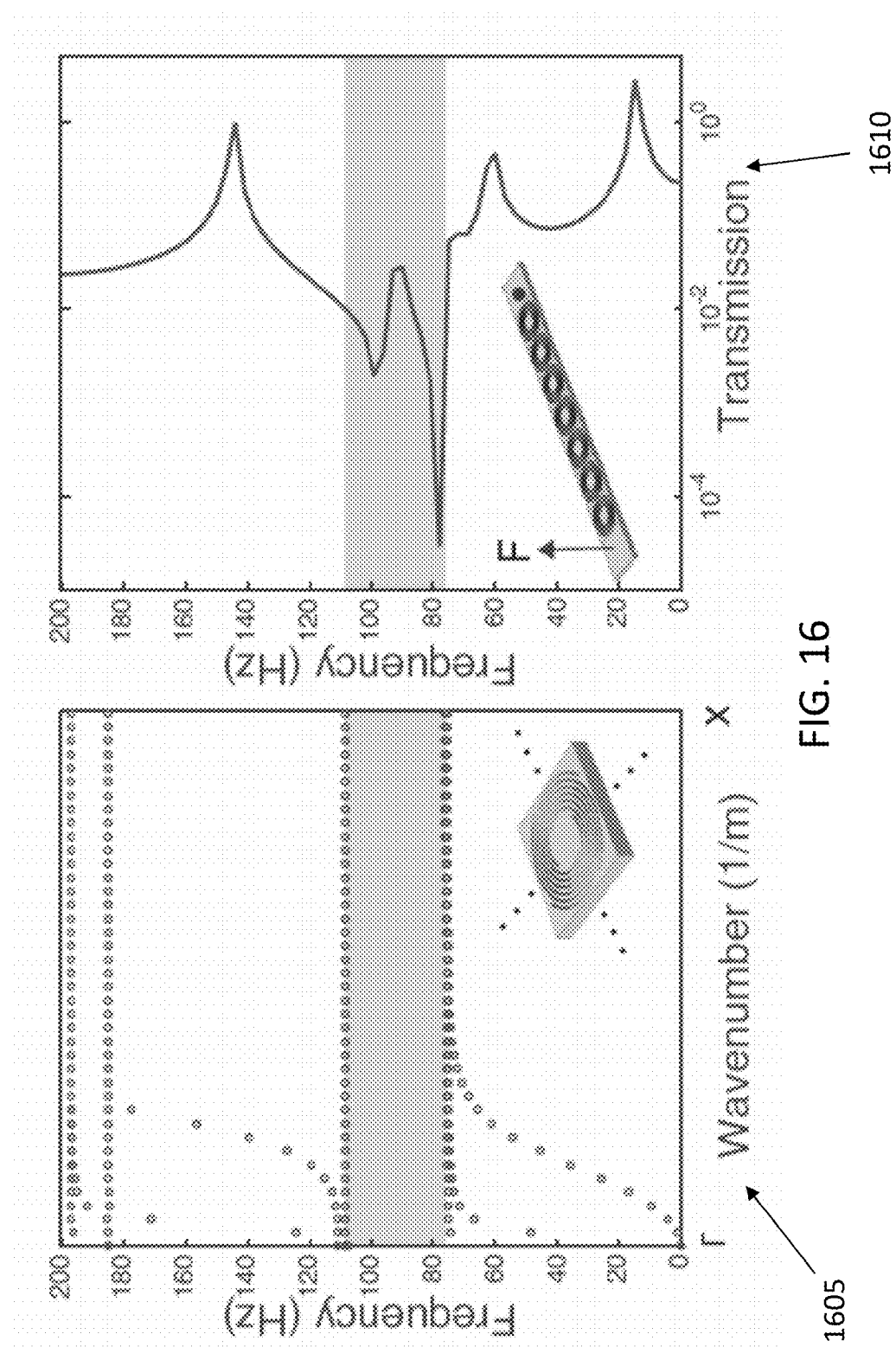

It is possible to calculate the band structure of an infinite array of the spiral-spring unit cells using the finite element method. The elastic wave equations are solved in three-dimensions and apply the Bloch wave formulation in-plane (i.e., Bloch boundary conditions). It is possible to consider the wave propagation along the direction of periodicity, in the Γ-X direction as illustrated in FIG. 16 (1605). It is then possible to construct a finite system, corresponding to the experimental setup, consisting of an array of 7 unit cells. It is possible to fix one end of the structure and apply a dynamic load to the other end. It is possible to obtain the frequency response function of the metamaterial as illustrated in FIG. 16 (1610). Both finite and infinite predictions agree well, particularly in the band gap frequency range, highlighted in gray. The band gap range also agrees well with the experimental results (FIG. 3).

Figure 17:
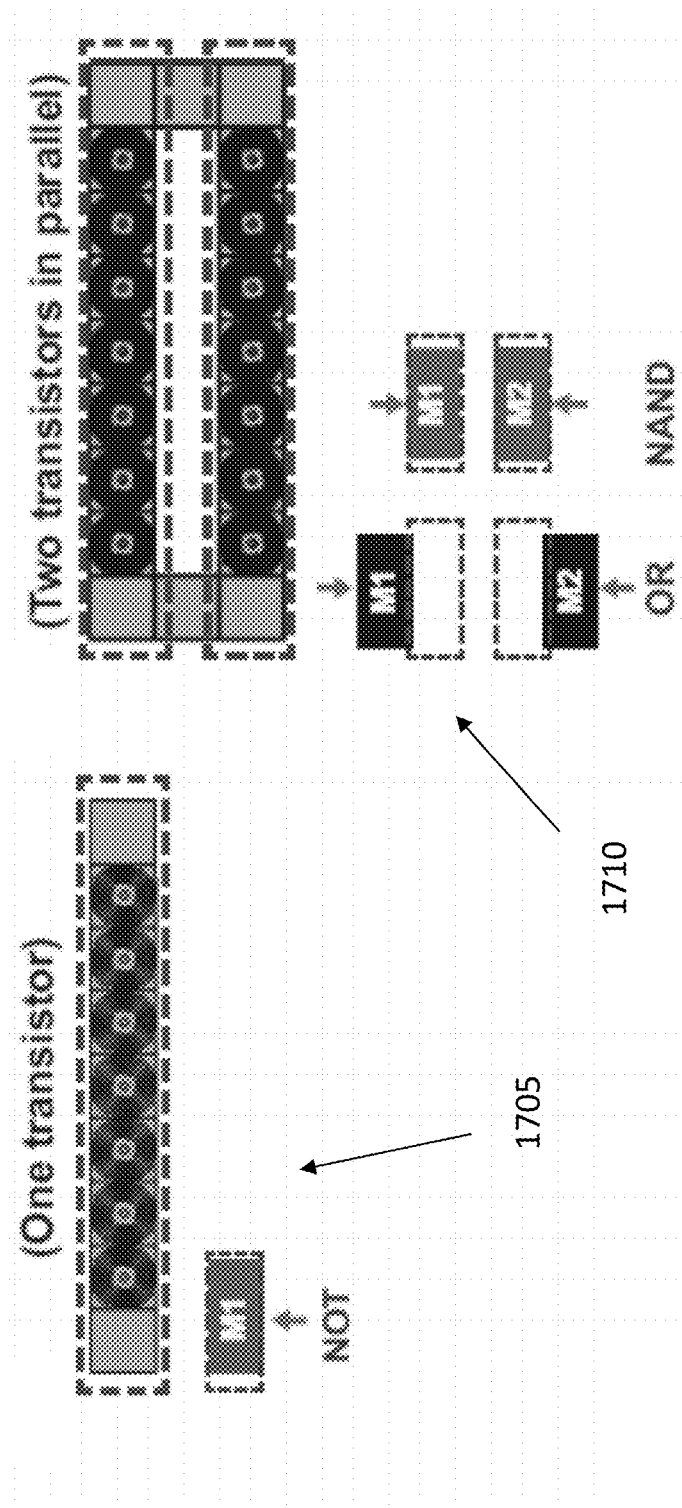
FIGS. 17-18 illustrate exemplary implementations of logic gates.
Figure 18:
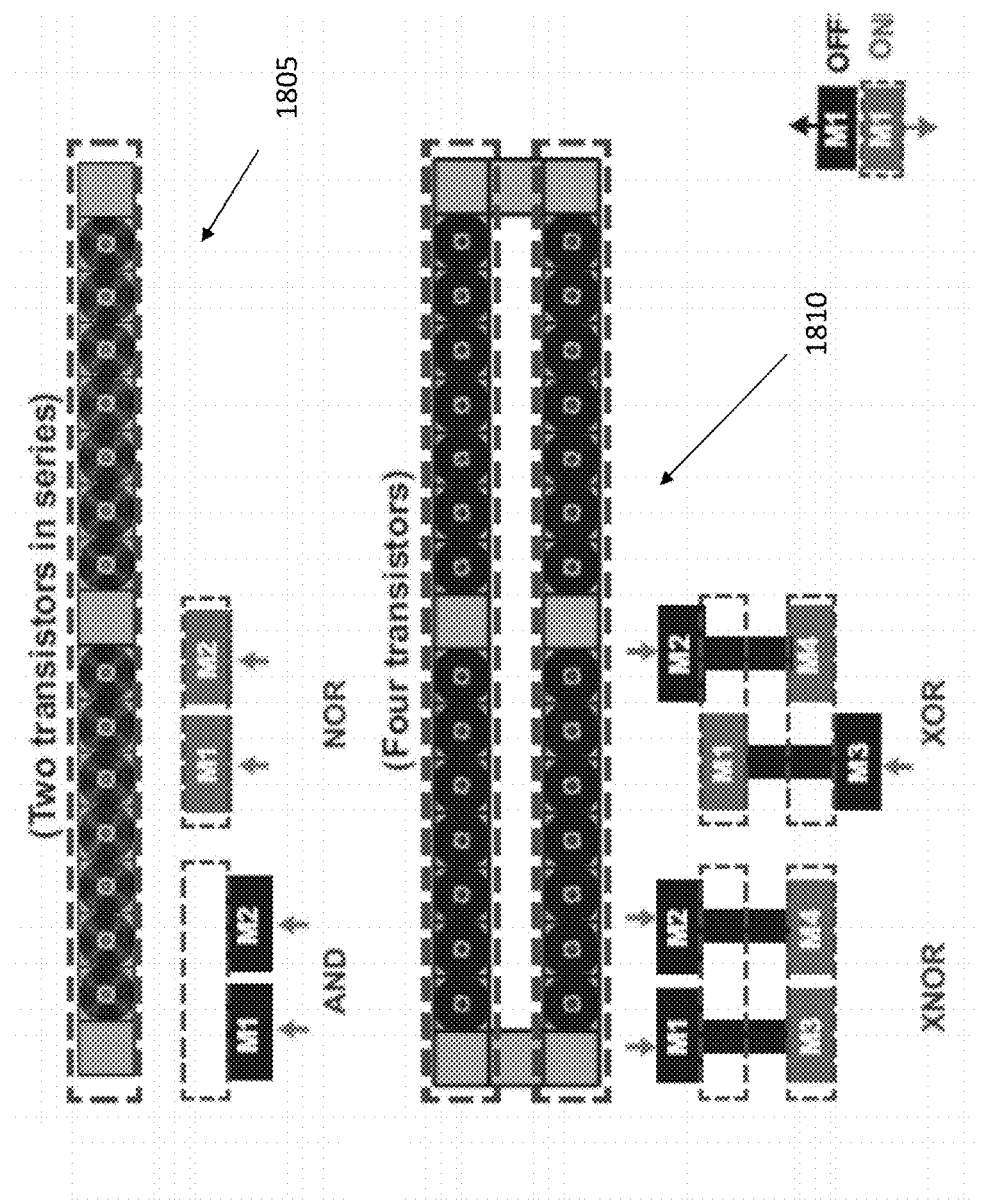

The unified logic platform described in the present disclosure is designed to perform all the mechanical logic operations, and is composed, in some embodiments, of four interconnected transistors. However, some of these operations could also be performed with a lower number of transistors, in different configurations. For example, the NOT operation requires only a single transistor, as illustrated in FIG. 17 (1705). The OR and the NAND operations can be achieved using only two transistors connected in parallel, as illustrated in FIG. 17 (1710). Similarly, the AND and NOR operations can be realized with two transistors connected in series, as illustrated in FIG. 18 (1805). The only two gates that require four interconnected transistors are the XOR and XNOR, as illustrated in FIG. 18 (1810).

Figure 19:
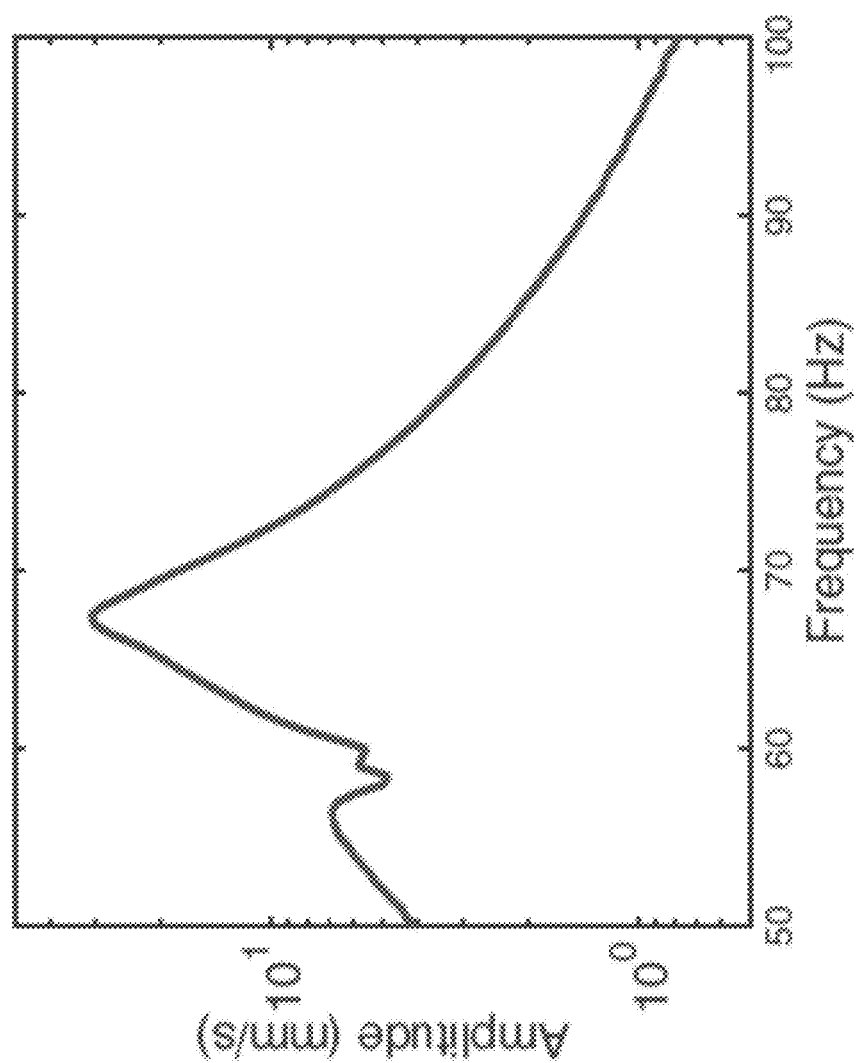
FIG. 19 illustrates exemplary data for a device.

The quality factor, Q, of the spiral-spring resonators in the metamaterial can be characterized by measuring the resonance amplitude of a single spring using a mechanical shaker as a harmonic excitation source and a laser Doppler vibrometer to detect the velocity of the central mass of the spring. The calculated $Q=f/\Delta f$ is $\approx 20$, as illustrated in FIG. 19, where f is the resonance frequency and $\Delta f$ is the width of the frequency range for which the amplitude is $1/\sqrt{2}$ of its peak value.

Figure 20:
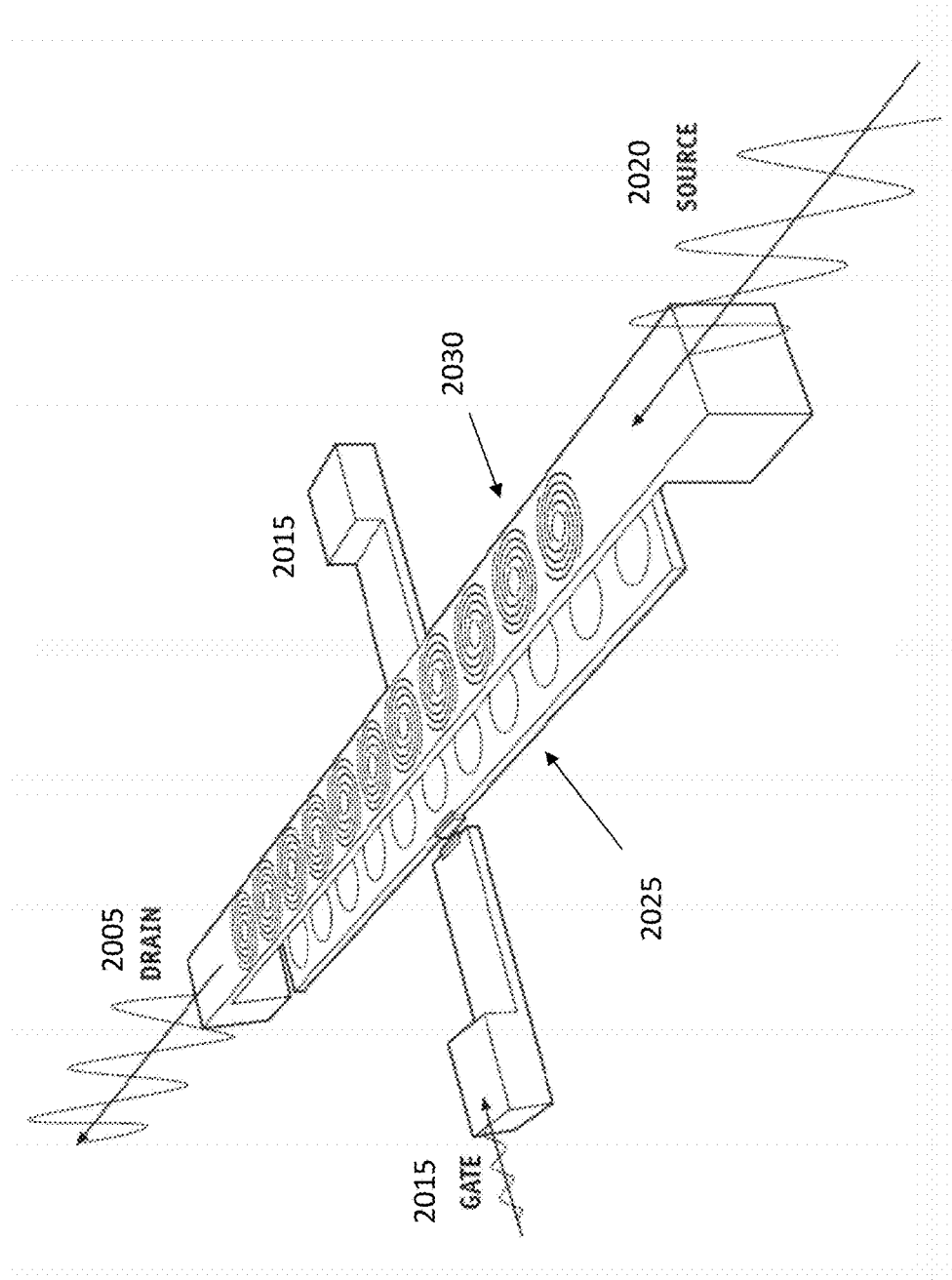
FIG. 20 illustrates a perspective view of the exemplary device described in FIG. 13.

FIG. 20 illustrates a perspective view of the exemplary device described in FIG. 13. In FIG. 20, a source (2020) and drain (2005) are controlled by the gate (2015) through the lateral alignment of the magnets as described in FIG. 13. The lower stage (2025) of magnets moves laterally, sideways, in order to align vertically with the upper magnets (2030) within the spiral structures configured to elongate upward to turn the phonon signal ON and OFF between the source and the drain. The spirals can be realized by grooves within the material that allow the structure to expand upward, and return elastically downward in a flattened position when the controlling magnetic force is removed. The grooves fully extend through the thickness of the material to allow expansion of the cantilevered sections. The grooves may be fabricated with different methods such as laser cutting or etching.

As discussed above in the present disclosure, phononic metamaterials rely on the presence of resonances in a structured medium, to control the propagation of elastic waves. Their response depends on the geometry of their fundamental building blocks. A major challenge in metamaterials design is the realization of basic building blocks that can be tuned dynamically. The present disclosure describes a metamaterial plate that can be dynamically tuned, by harnessing geometric and magnetic nonlinearities in the individual unit cells. The tuning mechanism allows to stiffness variability of individual unit cells and can control the amplitude of transmitted excitation through the plate, over three orders of magnitude. These concepts can be extended to metamaterial plates at different scales, and can be applied in a broad range of engineering applications, from seismic shielding at low frequency to ultrasonic cloaking at higher frequency ranges.

Phonons are lattice vibrations that are responsible for the propagation of sound, vibrations and heat at higher frequencies. The ability to understand and control phonons in these different domains are of extreme importance for practical applications and engineering devices, as acoustic lenses and cloaking materials. Phononic crystals and acoustic metamaterials are material systems that exploit the geometry and elastic properties of basic building blocks (the unit cells), often repeating in space, to manipulate phonons and redirect energy. Elastic metamaterials can present peculiar properties, such as negative effective density and stiffness. Phononic materials can be designed to present band gaps, which are frequency ranges where waves cannot propagate. When the metamaterials present resonances in their fundamental unit cells, the band gaps can occur at sub-wavelength frequencies, reflecting waves with wavelengths much larger than the size of the unit cells.

The linear response of phononic crystals and metamaterials have been studied extensively. However, the number of studies concerning nonlinear phononic materials is quite scarce in comparison to linear analyses. The richness of the dynamic responses arising in nonlinear metamaterials is substantial, including phenomena with no linear parallel, such as bifurcations, chaos and solitary waves formation. Metamaterials, both linear and nonlinear, can be used for filtering, localization, focusing, lensing, cloaking and guiding of waves. Potential applications of phononic metamaterials vary across a broad range of scales, from seismic wave protection, to heat shielding.

Owing to their physical realization, locally resonant metamaterials retain narrow subwavelength band gaps. Moreover, the fixed geometry and dimensions of the unit cell set a hardbound on the central frequency of the operational bandwidth. There exist many demonstrations of tunable phononic crystals, some of which utilizing an external magnetic field. Other methods to tune phononic metamaterials include piezo shunting, cell symmetry relaxation, embedded electromagnets, static loading, granular contacts and acoustic trapping. However, these metamaterials either lack the locality of element-wise programming, they continuously consume energy, or lack the ability to switch dynamically between desired material functionalities. Moreover, most existing tunable metamaterials require direct contact between the metamaterial and the programming method. Obtaining element-wise and real-time programmability of metamaterials, in a reversible manner, would allow their applications to new sensors, filters, and switches. The present disclosure describes a metamaterial plate that uses nonlinear interactions between its unit cells and an external magnetic potential. This allows for dynamically tuning wave propagation, within 300 ms, controlling the frequency range of deep subwavelength band gaps. The metamaterials used in the present disclosure, such as the material used to fabricate the spiral cantilevered structures of phononic transistors, can be referred to as reprogrammable, because they can be dynamically tuned spatio-temporally, and the tuning is reversible.

Figure 21:
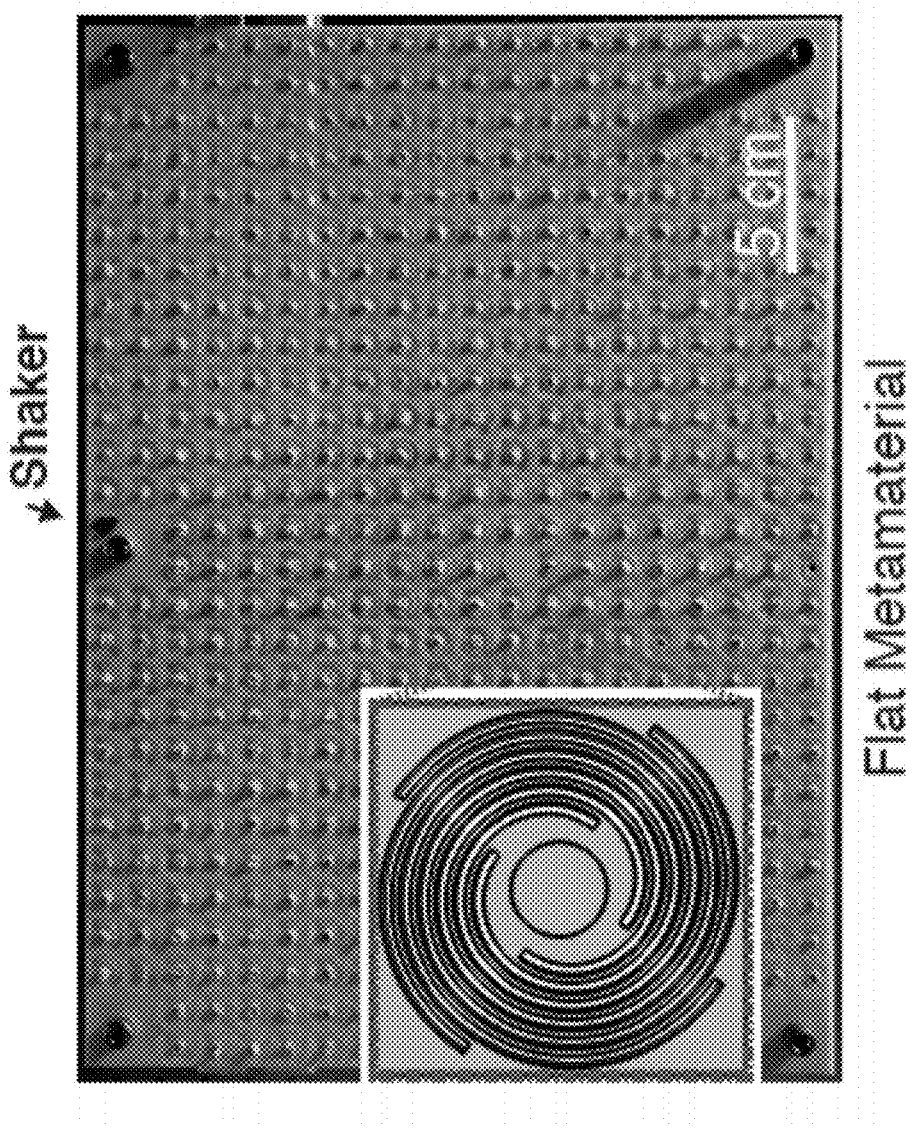
FIGS. 21-29 illustrate data for exemplary devices.
Figure 22:
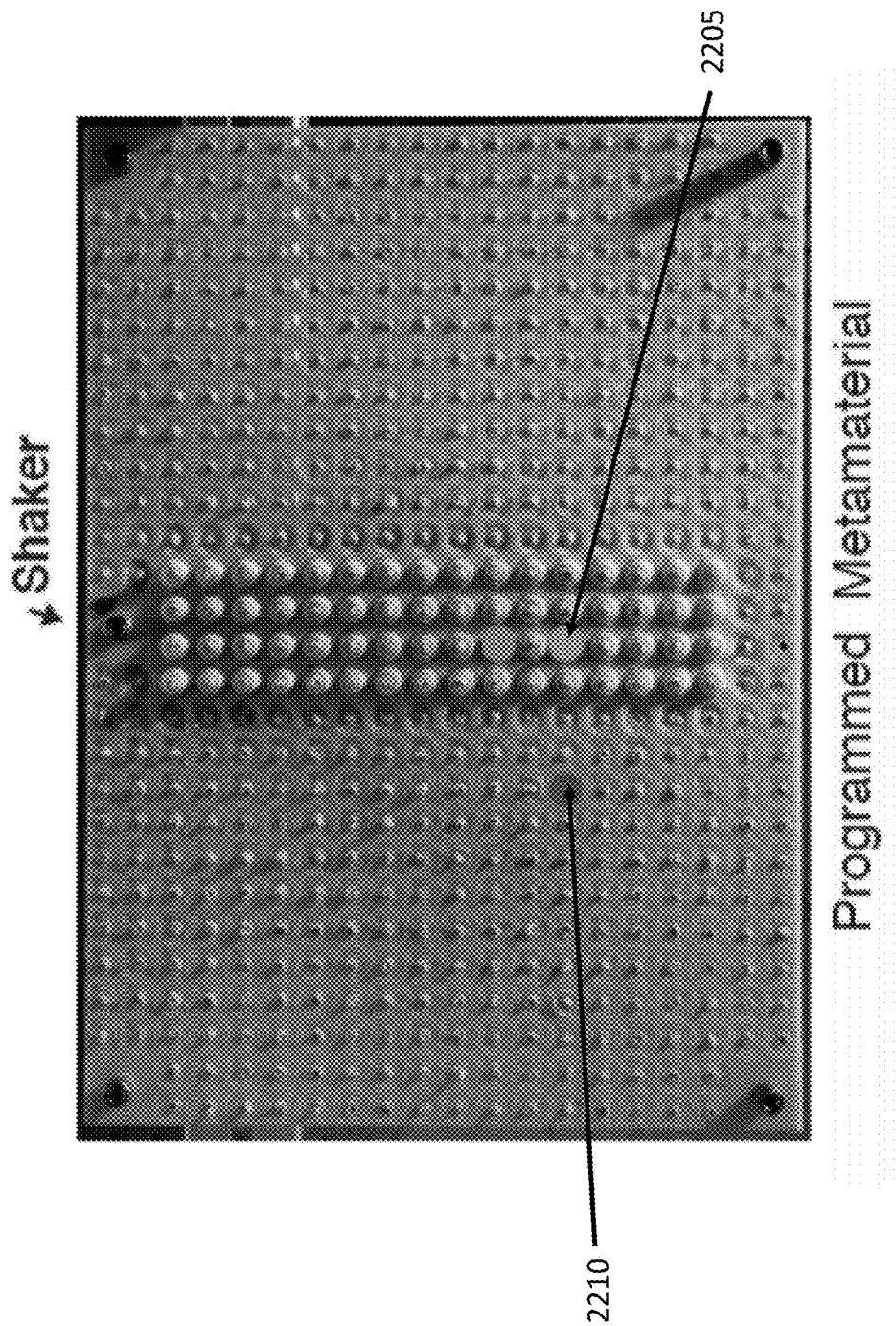
Figure 23:
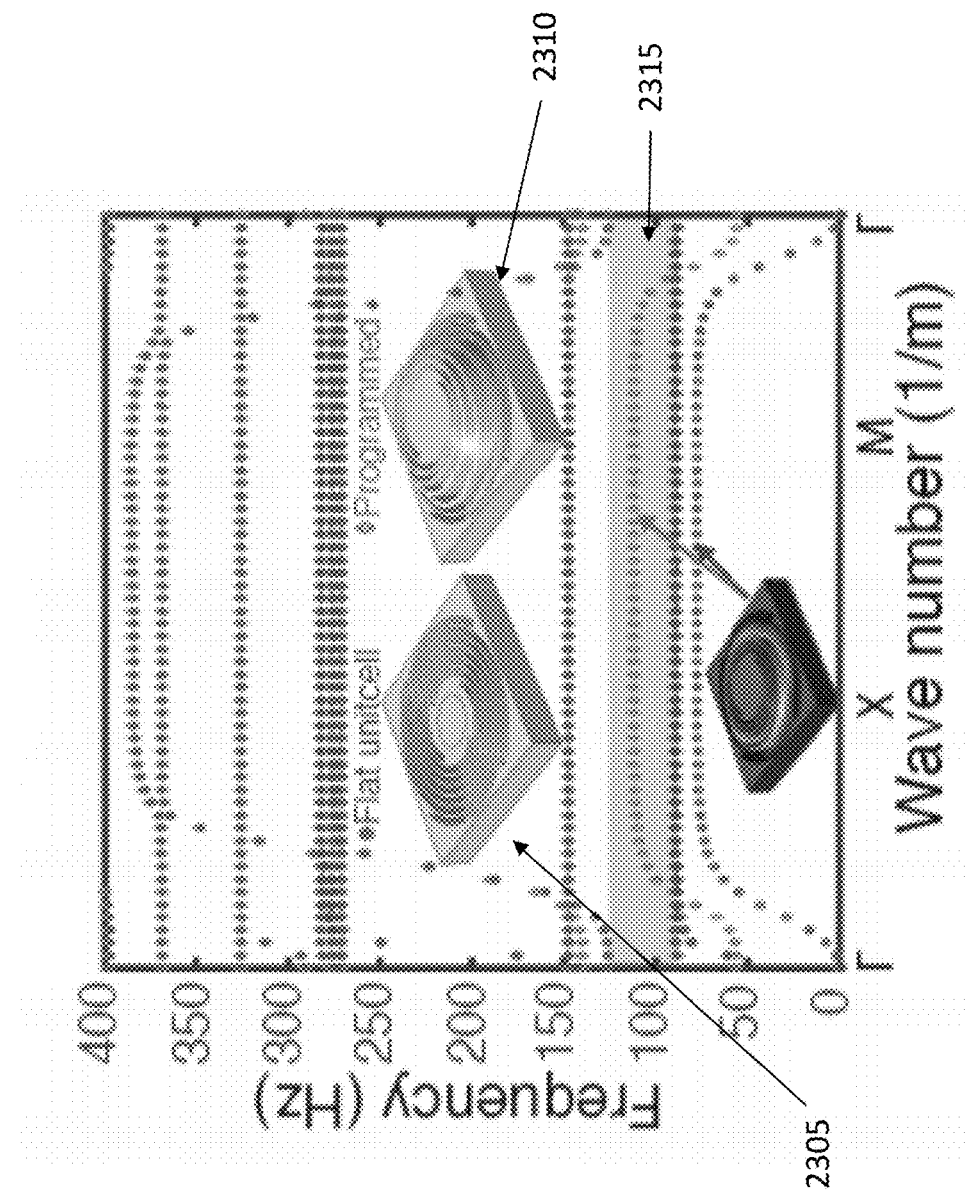

FIGS. 21-25 illustrate some metamaterial programming concept: Fabricated metamaterial with 28×20 unitcells in the (FIG. 21) flat 2D configuration and (FIG. 22) in the programmed 3D state. FIG. 23 illustrates numerically predicted dispersion curves for both configurations. The shaded region (2315) corresponds to the band gap for the flat unit cell. The magnetic forces at the center of the unit cells have been incorporated in the model as spring foundations. An exemplary spiral is shown in the flattened configuration (2305) and the extended or vertically expanded configuration (2310).

Figure 24:
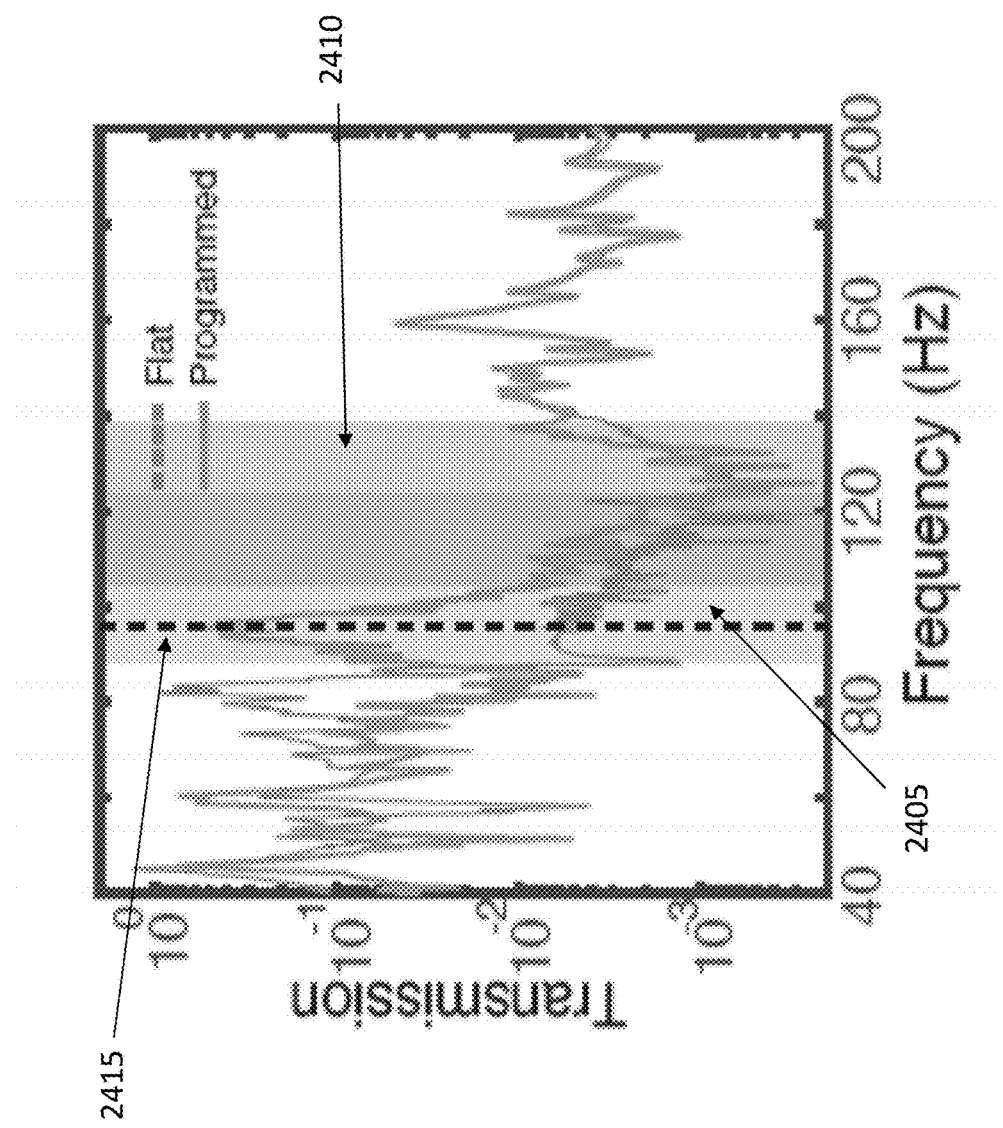
Figure 25:
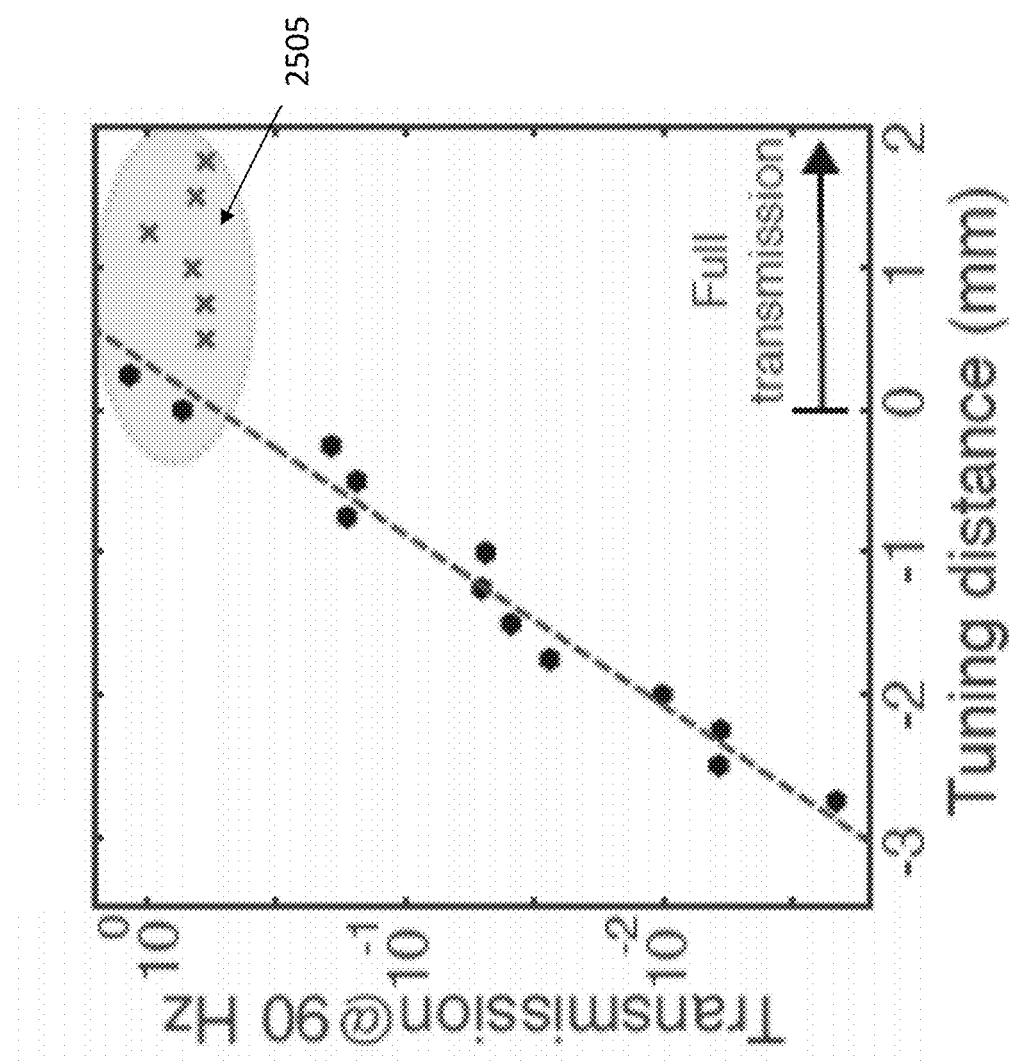

FIG. 24 illustrates the frequency response function of the two configurations with the bandgap for the "flat" configuration shown by the shaded region (2405). The bandgap for the "programmed" configuration and the new band gap after programming are shown in shading (2410). The line (2415) indicates the frequency f=96 Hz. FIG. 25 illustrates the transmission at a single frequency, f=90 Hz, as a function of tuning distance of the magnets from the metamaterial plate. The shaded area (2505) represents the maximum transmission region.

The realized metamaterial plate is composed, in some embodiments, of spiral-spring unit cells, periodically repeated in the x and y directions to form a 28×20 array (FIGS. 21-22). Each unit cell is composed of 4 concentric Archimedean spirals with a magnet embedded in its center. The resonators have a quality factor, Q, of ≈52. This design has the ability to attenuate a range of ultra-low frequencies in all directions, supporting the formation of a complete band gap between 89 and 126 Hz. The out-of-plane unit cell mode shape, at the edge of the attenuated range, is responsible for forming the band gap. Varying the stiffness of this particular mode, it is possible to tune the edge of the band gap to higher or lower frequencies. Non-contact magnetic forces are used to vary the stiffness of the unit cells (by displacing the spring in and out of plane) and tune the metamaterial's dispersion relation. Underneath the metamaterial plate, an array of permanent magnets (referred to as the "tuning magnets") is used to create a controllable magnetic potential that can be tuned by moving the magnets closer to or further away from the metamaterial plate (along the z axis). As the magnets approach the unit cells, repulsion forces intensify nonlinearly.

When the tuning magnets are close to the metamaterial plate, the unit cells transform from a 2D flat configuration into a 3D "programmed" geometry. This shape change alters the effective stiffness of the resonators and the calculated dispersion relation of the plate (FIG. 23). This can be confirmed experimentally, measuring the transmission spectrum of harmonic elastic vibrations propagating through the plate (FIG. 24). When the tuning magnets are close to the plate ("programmed" configuration) the band gap edge shifts to around 96 Hz, within the band gap area of the "flat" configuration. This shows a binary (digital) programmability of the material, at a given frequency, from transmission to no-transmission states and vice versa. However, by controlling the strength of the magnetic field (i.e., the position of the magnetic tuning stage), the material's programmability can be used either as a binary (On/Off transmission) or analog. In order to show the analog (continuous) programmability of the phononic properties of the material, it is possible to plot the measured transmission amplitude as a function of the distance between the tuning magnets and the plate. The zero point is defined as the first full transmission value, after which the system is in a pass band. Before full transmission, the material shows continuous tuning behavior, from complete attenuation to full transmission in a linear fashion (the fitted dashed blue line considers only the black dots before full transmission). This corresponds to a transmission tunability that spans about three orders of magnitude.

Figure 26:
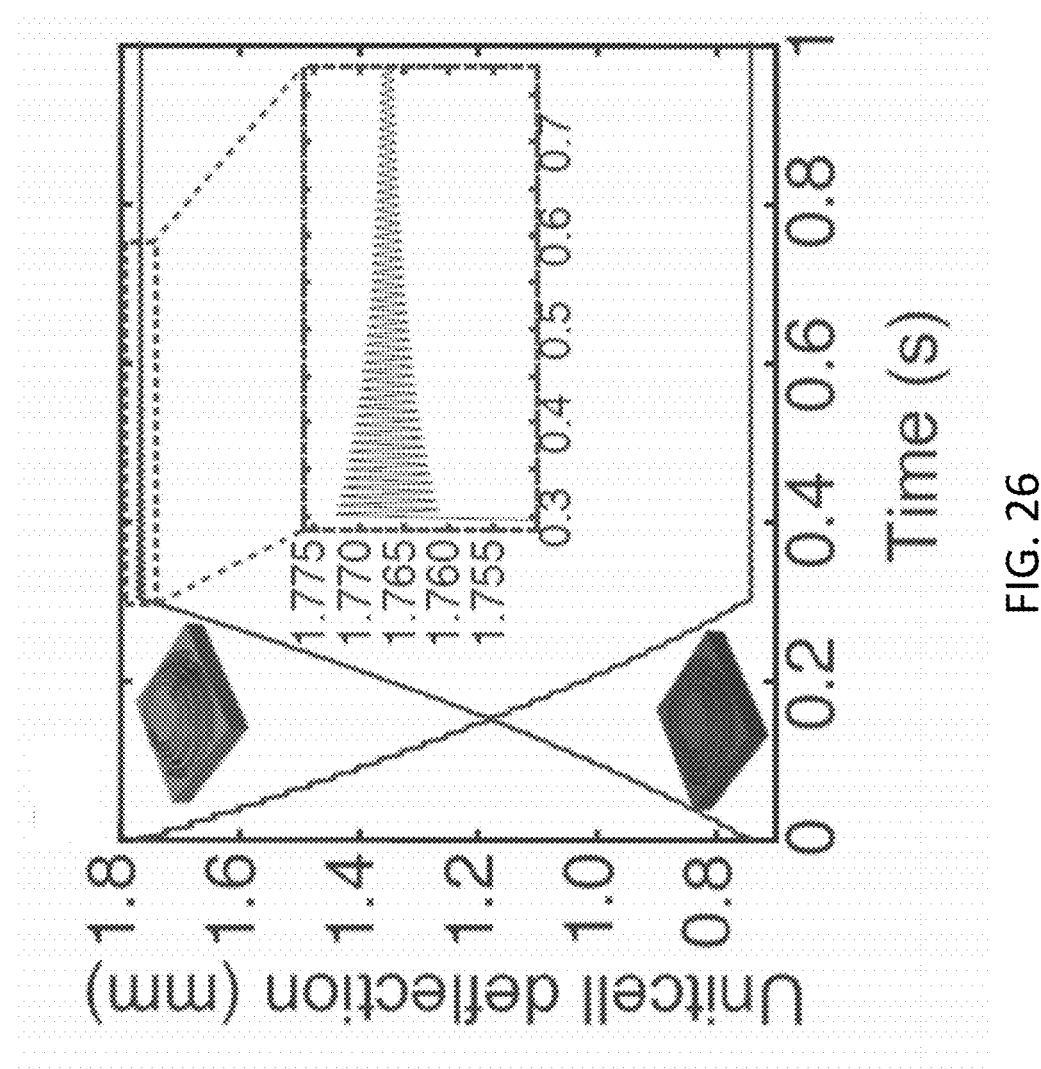
Figure 27:
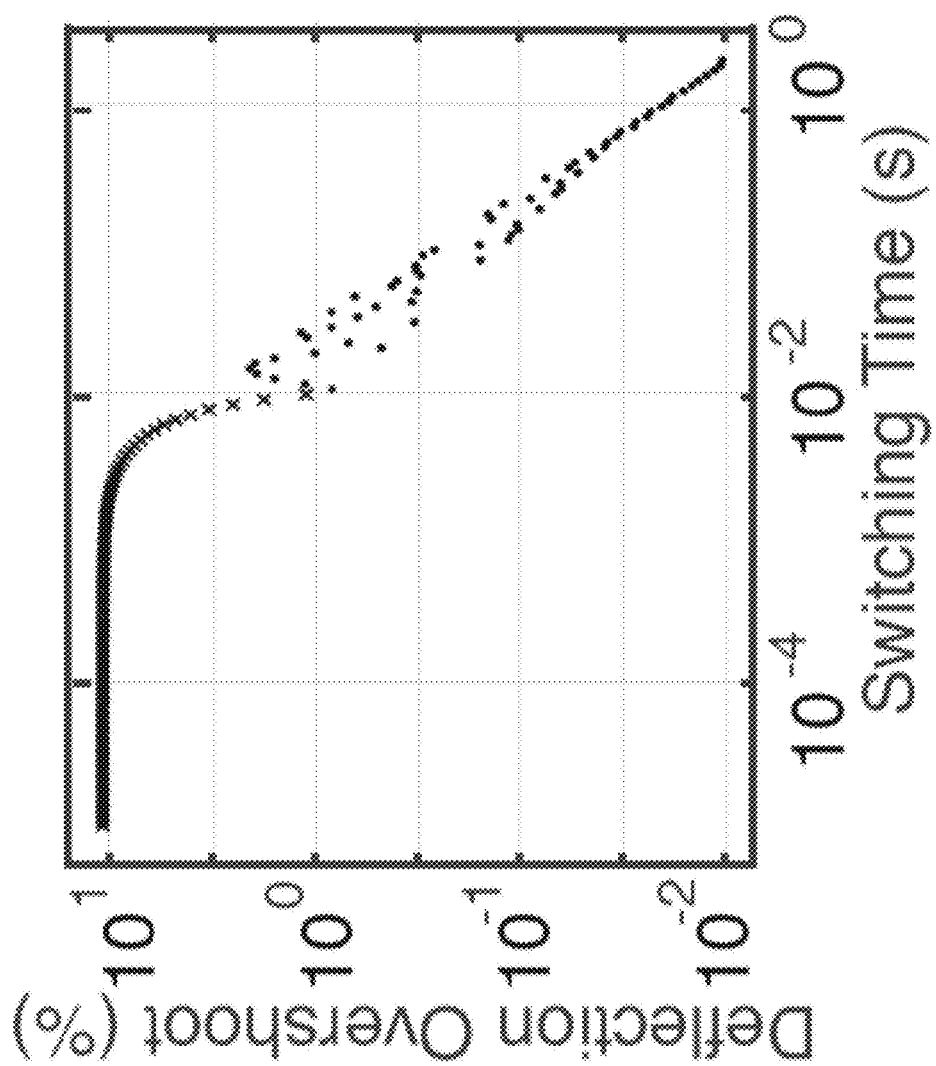
Figure 28:
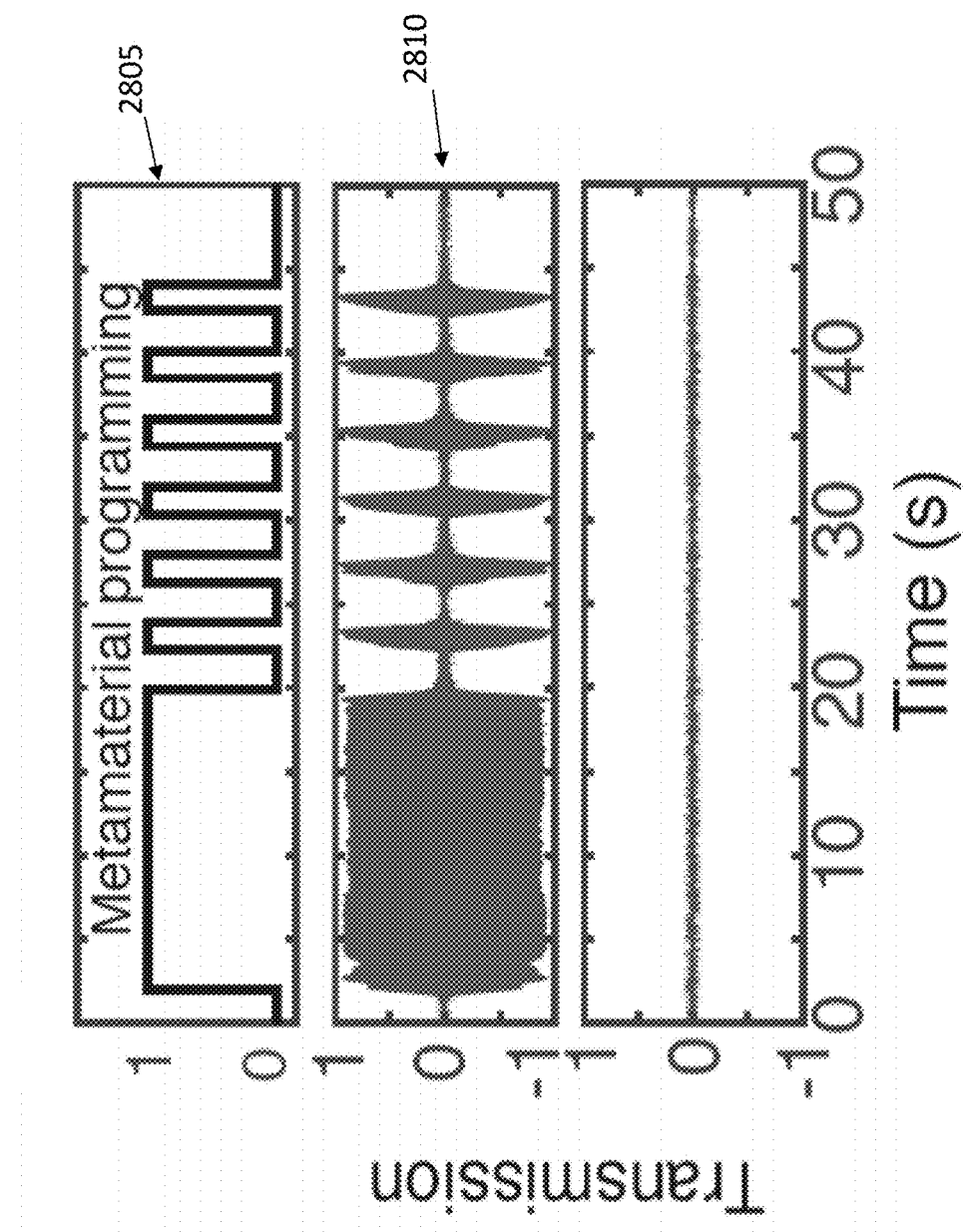
Figure 29:
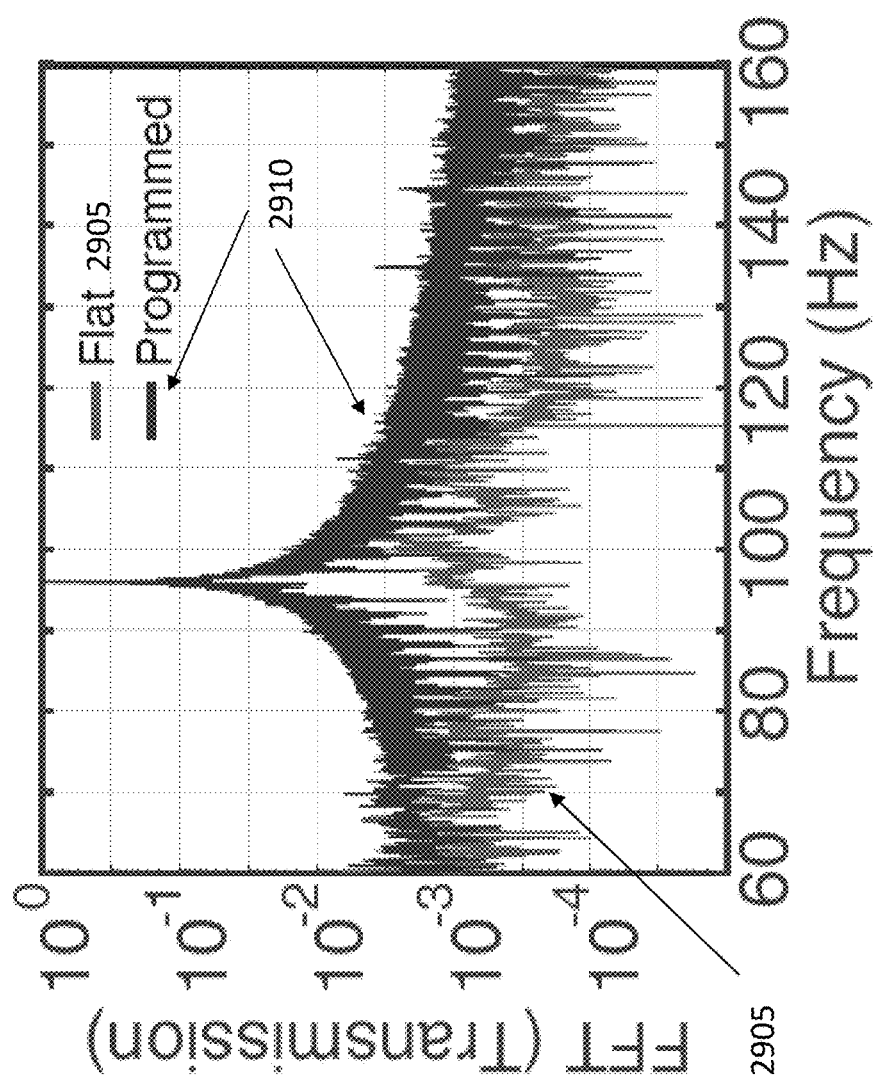

FIGS. 26-29 illustrate exemplary metamaterial temporal programming: FIG. 26 illustrates a numerical analysis of the interaction between the magnetic field and a single unit cell deflection of 1 mm when transformed from 2D to 3D (and vice versa) within 300 ms time interval and the transient deflection overshoot in the zoomed in inset. FIG. 27 illustrates the deflection overshoot error percentage plotted as a function of switching speeds ranging from 10 microseconds to 2 seconds. FIG. 28 illustrates a preprogrammed temporal pattern of the metamaterial in time (2805), transmitted signal at the dot (2205) in FIG. 22 within the programmed region (2810) and the transmitted signal at the dot (2210) in FIG. 22 outside the programmed guide. The utilized stage can move between the two programming positions (i.e., On/Off) in ≈300 ms. FIG. 29 illustrates the fast Fourier transform (FFT) of the transmitted signal when the unit cell is 3D "programmed" and 2D "flat".

In order to investigate the tunability of the metamaterial in time, it is possible to model the transformation of a single unit cell from the flat (2D) to programmed (3D) configuration and vice versa. It is possible to use finite element analysis to determine the effective stiffness of the unit cell for the different measured magnetic forces. Then, it is possible to formulate the equation of motion of the system using the stiffness of the unit cell and the tuning time to calculate the initial oscillations of the resonator center around its equilibrium position (overshoot). In the current configuration, chosen as a proof of principle, the linear stage controlling the array of magnets can tune the geometry of the unit cells in approximately 300 ms. This tuning speed leads to a maximum overshoot of the center of the resonator from its final position of about 0.5% (FIG. 26). It is worth noting that the center of the unit cell oscillates around ≈89 Hz when transforming from 3D to 2D and around ≈105 Hz from 2D to 3D. These two frequencies correlate to the lower edge of the band gap in the flat and the programmed configurations. The increase in the resonance frequency from 89 to 105 is due to the added stiffness to the mode shape at the edge of the band gap. This tuning speed can be significantly increased, using either a faster stage or electromagnets in place of permanent magnets. It is possible to use the same model to calculate the deflection overshoot as a function of tuning time in a log-log plot in FIG. 27. This suggests an overshoot of as low as 1% for tuning time of 10 ms.

In order to demonstrate the ability to change the metamaterial's phononic properties in time, it is possible to program the magnetic array underneath the meta-plate (fixed to a linear stage) to move up and down in different time windows, as in FIG. 28, (2805). It is possible to continuously excite the system harmonically at 96 Hz and measure the transmission through the material. The measured transmitted wave inside the tuned spirals follows the programmed temporal pattern, showing a clear distinction between transmission and no-transmission states. The measured transmitted wave signal at the red dot (outside the controlled region) is immune to the changes taking place in the rest of the system, despite the fact that the measured site is only three unit cells away from the transmission guide. This implies robustness of the system and shows the locality of the element-wise control of the unit cells in the metamaterial. The fast Fourier transform (FFT) of the transmission signal inside the controlled region for the time windows in both configurations flat and programmed is plotted in FIG. 29. The FFT for the "programmed" state shows the single frequency content of the transmitted signal, while the "flat" state FFT demonstrates the absence of any significant frequency content. Moreover, the behavior of the system does not deteriorate over time after repeating the switching cycles ≈1000 times, indicating the absence of plastic deformation or damage in the material.

Figure 30:
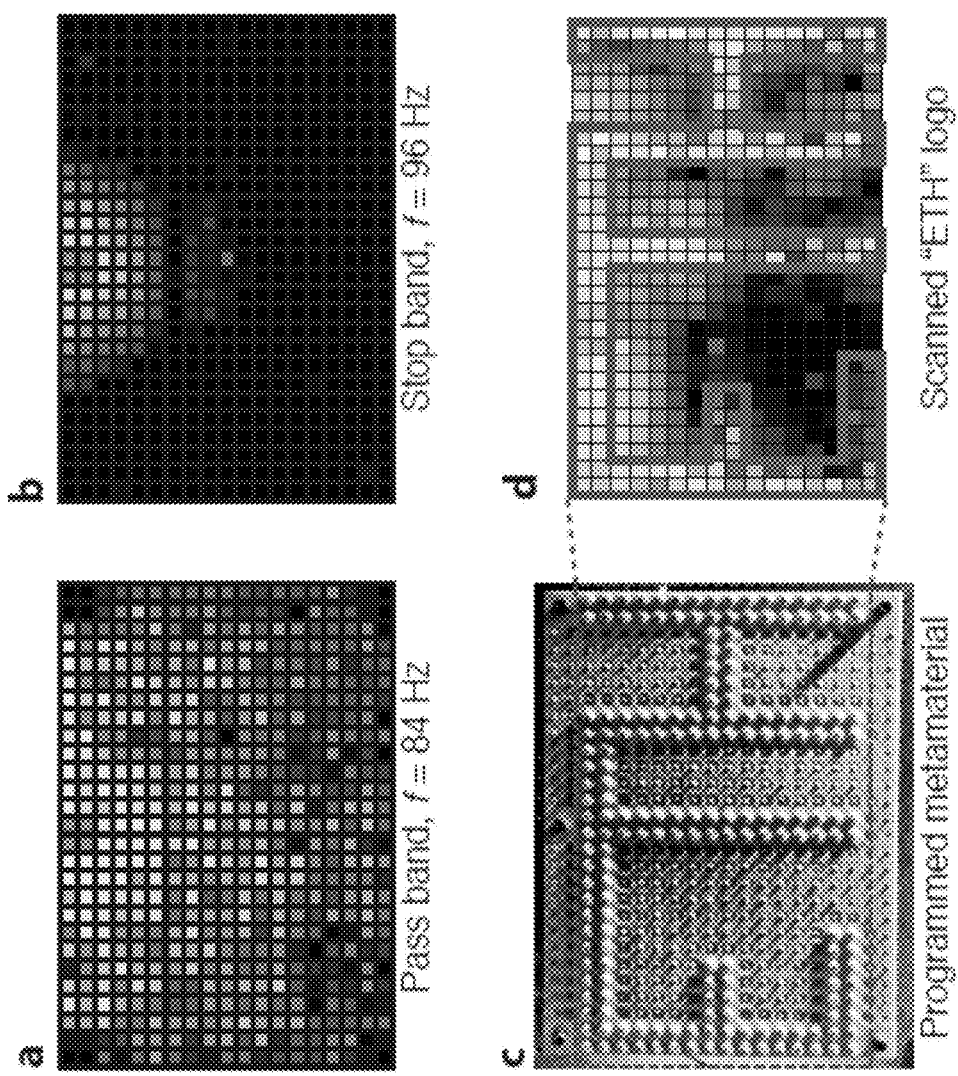
FIGS. 30-31 illustrate plates containing multiple spirals, and related heat maps.

To investigate the wave propagation characteristics throughout the entire plate, it is possible to first select two different frequencies; one within the pass band ($f_1$=84 Hz) and the other in stop band frequency ($f_2$=96 Hz). It is then possible to excite the plate with out-of-plane, harmonic vibrations on its top side, using a mechanical shaker, with $f_1$ and $f_2$ separately. A scanning laser vibrometer can be used to record the wave velocity at the center of each unit cell. It is then possible to plot the transmission data for each of the frequencies as a heat map (FIG. 30, panels a and b). Within the pass band frequency ($f_1$=84 Hz), FIG. 26, full propagation of the wave throughout the plate exists. In the stop band frequency $f_2$, it is possible to record an exponential decay in transmission amplitude. In both cases, there is an intense radial wave field close to the source (top center of the plate), because of the inherent damping of the material. It can be noted that the displacement of the plates due to its resonant modes cannot be resolved in the measured signals. This is because there is a large difference between the stiffness of the plate and that of the unit cells (which are much softer and undergo larger displacements).

FIG. 30 illustrates exemplary metamaterial spatial programming: Particle velocity scans of the metamaterial when excited at the top-center harmonically within a pass band (panel a) and a stop band (panel b). In panel c the ETH logo is programmed using magnetic potentials and its corresponding heat scan is illustrated in panel d, when excited harmonically at 96 Hz.

To explore the limits of the element-wise control and exploit the versatility of the presented platform, it is possible to control the spatial energy propagation designing more "complex" waveguides on the metamaterial plate. Because of the ability to tune individual elements, it is possible to create a vast number of wave guiding configurations. If a higher resolution wave-guiding ability is needed, it is possible to add more unit cells in both directions.

One of these configurations resembling an ETH logo is illustrated in FIG. 30 panels c and d. Similar to the former wave propagation scans in FIG. 30 panels a and b, the plate is harmonically excited from the middle of its top side, and the transmission pattern is scanned throughout the plate. The intensity of the transmitted waves (FIG. 30 panel d) clearly highlights the logo's profile. It should be noted that the letters E,T& H are close to the vibration source and they expand the radial decaying pattern observed in FIG. 30 panels a-b to span the entire plate width. It is evident that the metamaterial requires 3-4 unit cells to significantly attenuate the waves. This decay distance should be accounted for in the design of potential applications. The ability to tune the individual cells continuously (analog tuning) allows for the realization of metamaterial plates with an infinite number of possible wave propagation pathways.

Figure 31:
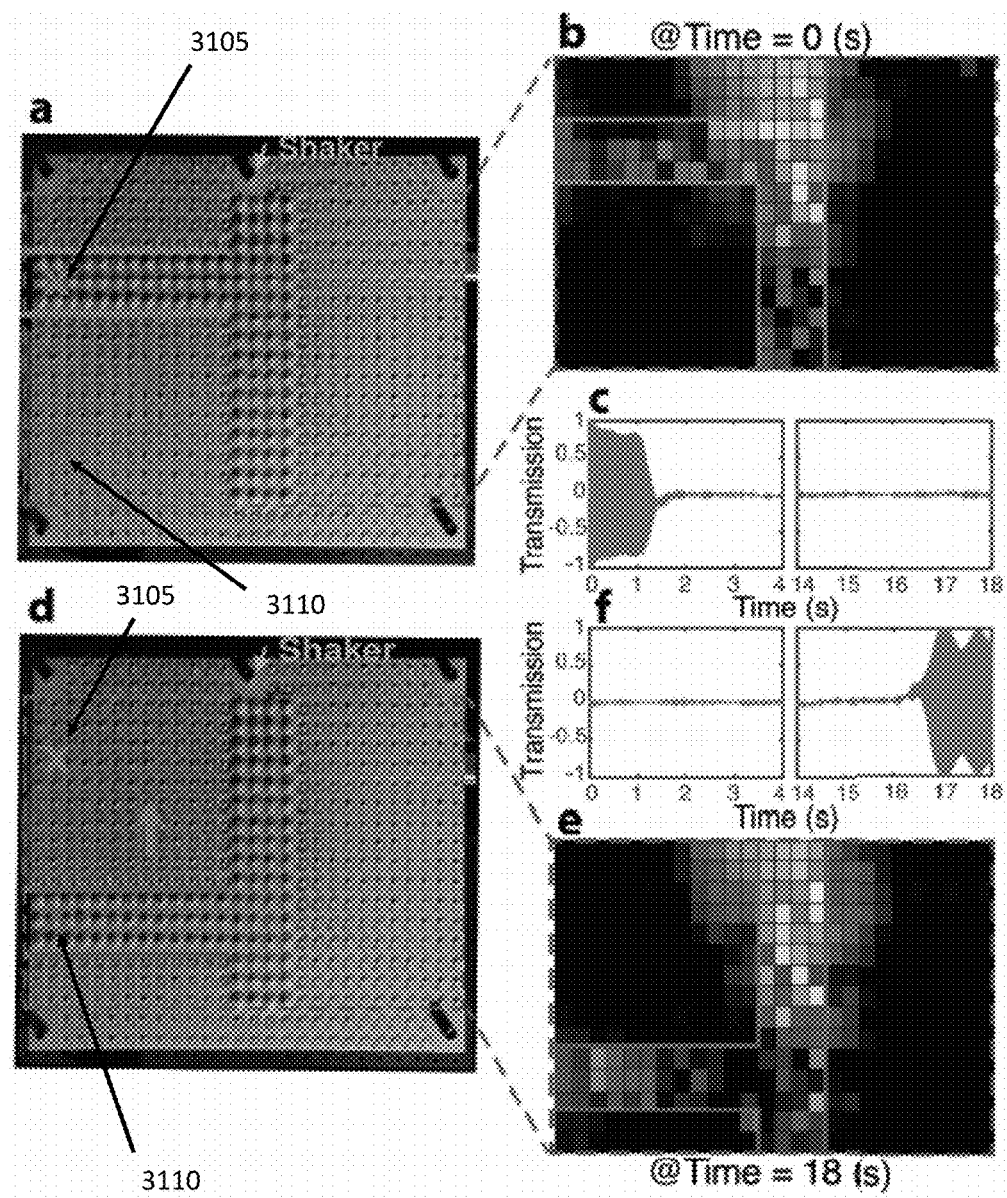

FIG. 31 illustrates an exemplary metamaterial spatio-temporal programming: FIG. 31 panel a illustrates a vertical wave-guiding channel, with a bend towards the top left corner indicated by the cross marker (3105) of the plate. FIG. 31 panel b illustrates experimental scan of transmitted waves throughout the spatially programmed pattern in panel a. FIG. 31 panel c illustrates the measured transmission signal at the cross marker (3105) in time. FIG. 31 panel d illustrates the reprogrammed metamaterial, now with a bend towards the cross marker (3110). FIG. 31 panel f illustrates the measured time signal at the cross marker (3110) during the reprogramming process. FIG. 31 panel e illustrates an experimental scan of the transmitted signal through the metamaterial after the reprogramming.

The experiments discussed herein, above, show the ability to tune the dynamic response of the plate either in time (FIGS. 26-29) or in space (FIG. 30). In many practical applications, however, it may be desirable to be able to reconfigure dynamically the spatial propagation of waves in a medium, for example, to selectively mitigate vibrations in precise areas of a surface, which could vary with time. The metamaterial plate described in the present disclosure achieves this functionality, by varying the position of the tuning magnets in space and time.

It is possible to demonstrate this experimentally in a waveguide with a 90° degrees bending angle, which redirects excitations from the top side of the plate to the different position along the right edge—see the cross marker (3105) in FIG. 31 panel a. It is possible to create this waveguide using magnets mounted on a movable rail. To visualize the dynamics of the plate, a laser scanning vibrometers can be used to plot the vibration intensity transmitted through the plate in FIG. 31 panel b. The time signal of the propagating wave at time=0 s is presented in FIG. 31 panel c. It is possible to then program the horizontal stage to move towards the lower edge of the waveguide, FIG. 31 panel d. When the stage stops (at time=18 s), it is possible to scan the plate once more to observe the change in wave transmission through the waveguide (FIG. 31 panel e). Similar to the data presented in FIG. 31 panel c, it is possible to record the time signal at the cross marker (3110) in FIG. 31 panel f. Both panels c and f in FIG. 31 show the immunity of the transmitted signal to noise, when the waveguide is evolving from one state to the other. The time spanned between the two states, from the cross marker (3105) to the marker (3110) can be reduced significantly by using faster stages or by utilizing electromagnetic tuning elements for controlling the individual resonators.

The present disclosure describes the design and realization of a tunable phononic metamaterial with programmable deep subwavelength band gaps. It is possible to dynamically control the wave propagation through the metamaterial, switching the signal in time and guiding it in space, using a non-invasive element-wise magnetic potential. This reversible "programmability" of the metamaterial, resolved at the unit cell level, can have impact in the design of advanced functional materials, programmable matter and transducers for acoustic imaging, lensing and non-destructive evaluation devices.

For the fabrication of the metamaterial in the embodiments described above with reference to FIG. 31, a printer was used to fabricate the device. The lattice spacing between the metamaterial unit cells is 12.5 mm. Cylindrical neodymium-nickel-plated magnets, with a 3 mm diameter and a 2 mm thickness, were embedded in the center of each unit cell. The printing material utilized is polycarbonate, with Young's modulus of 2.3 GPa and density of 1200 Kg/m$^3$. The measured quality factor of the metamaterial is 52 (FIG. 30). An MDF (medium-density fiberboard) plate with 28×16 cylindrical holes placed underneath the metamaterial plate. Each hole can fit a magnet strong enough to tune the phononic properties of the metamaterial (by transforming the unit cells from 2D to 3D). The array of control magnets with a 5 mm diameter and 4 mm thickness was placed on a movable stage, below the array of unit cells, to tune the intensity of the magnetic field. For the space-time re-programmability in FIG. 31 two independent MDF plates (13×3 and 16×4 magnets) were mounted perpendicular to each other on a linear stage, with the ability to move in the x-y plane. The joint part (the two perpendicular stages) is then mounted on a vertical linear stage to achieve the mobility in the z direction.

Figure 32:
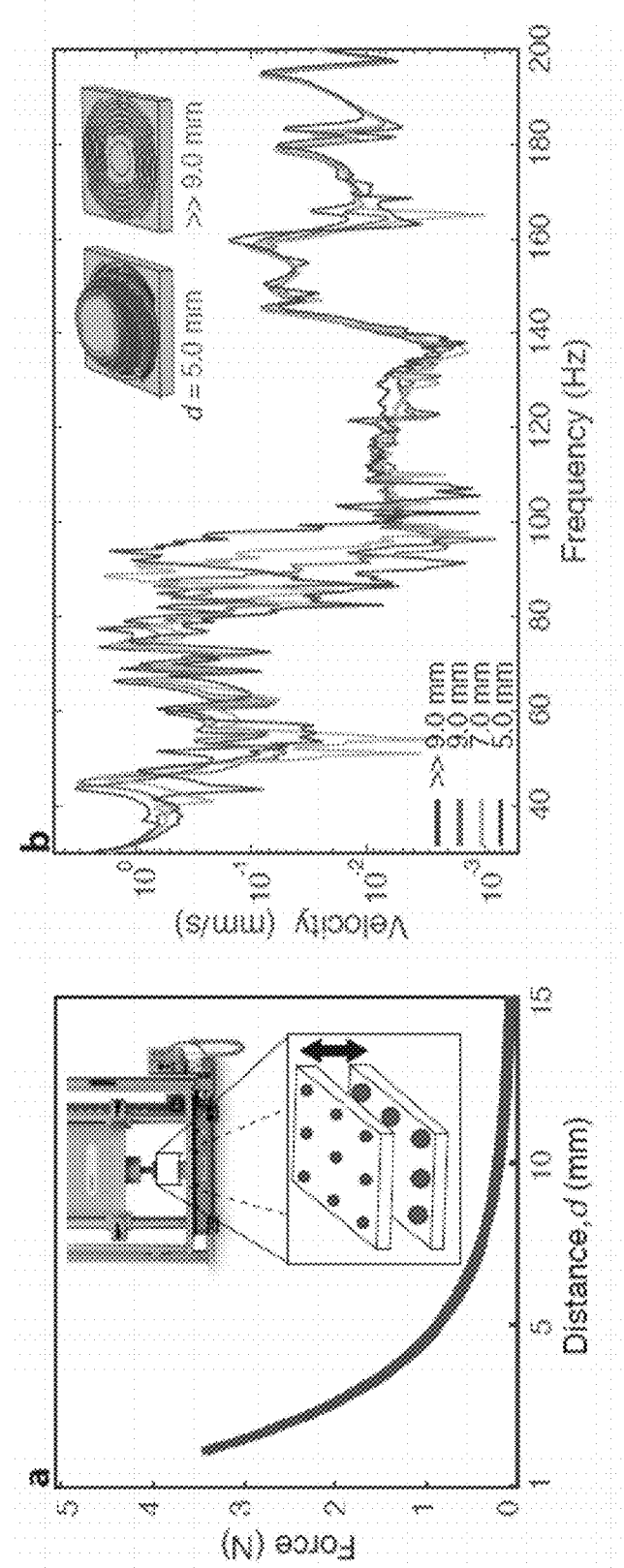
FIG. 32 illustrates exemplary magnetic force measurements.

It is possible to characterize the magnetic force between a 3×3 array of magnets of diameter 5 mm and thickness of 4 mm resembling the controllable magnetic field underneath the metamaterial plate. The array is fixed to the force-sensing clamp in the mechanical testing machine. Another array of 3×3 magnets is fixed to the opposite clamp, 3 mm diameter and 2 mm thickness similar to the magnets embedded in the metamaterial. The compression test starts with the magnets at 15 mm distance. The magnet arrays move closer to each other and the repulsion force is recorded as illustrated in FIG. 32. The force-distance curve obtained shows a nonlinear continuous increase in the force amplitude, as the distance between the plate and the magnetic stage decreases.

FIG. 32 illustrates the measured repulsion forces between control magnets, placed underneath the metamaterial, and the embedded magnets in the center of each metamaterial unit cell. The inset of panel a shows a schematic diagram of the experimental setup. Panel b illustrates the particle velocity measured at the center of a spiral unit cell, with various magnetic potentials (with the moving magnetic stage at different distances, d, from the plate). The inset of panel b shows both the flat and programmed unit cells.

Figure 33:
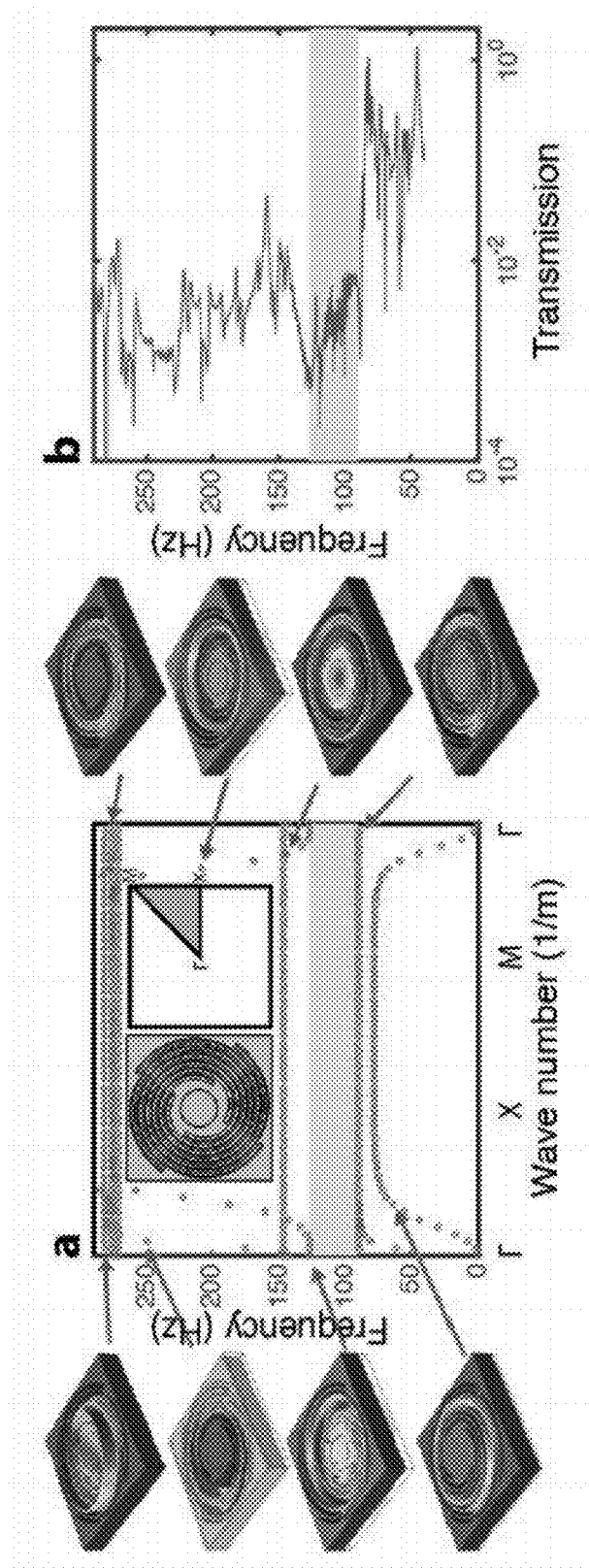
FIG. 33 illustrates vibration modes of a spiral.

It is possible to evaluate the metamaterial band structure using a finite element method. An infinite array of the spiral unit cells is modeled in both x and y directions. The elastic wave equations are solved for a heterogeneous medium:

$$\nabla \cdot C : \frac{1}{2}(\nabla u + (u)^T) = \rho \ddot{u},$$

where $\nabla$ is the gradient operator, C is the elasticity tensor, u is the displacement vector, $\rho$ is the density, x={x, y, z} is the position vector, and $(.)^T$ is the transpose operation. To obtain the band structure the Bloch wave formulation is applied in both x and y directions (i.e., Bloch boundary conditions). The Bloch solution is assumed to be in the form $u(x, k; t) = \tilde{u}(x,k) e^{i(k \cdot x - \omega t)}$ where $\tilde{u}$ is the Bloch displacement vector, k is the wave vector, $\omega$ is the frequency, and t is the time. It is possible to consider the wave propagation along the edges of the irreducible Brillouin zone, in the Γ-X-M-Γ directions (FIG. 33). The region of no transmission (band gap) is shaded in gray. It is possible to compare the theoretically obtained dispersion curves in FIG. 33 panel a, to the experimentally measured transmission signal at the center of the fabricated finite metamaterial plate, consisting of an array of 28×20 unit cells. The corners of the metamaterial array are fixed, and the top center of the plate is excited. It is then possible to obtain the frequency response function of the metamaterial as illustrated in FIG. 33 panel b. Both finite and infinite predictions agree well, particularly in the band gap frequency range, highlighted in gray. Outside of this gray area, there exist frequency regions with low transmission. However, these regions are not full band gaps (i.e., a band gap for all mode shapes, along all symmetry directions). In the dispersion analysis, a full 3D finite element modeling is used, to capture all aspects of the unit cell dispersion. What is referred to as a band gap is a complete band gap. However, there are bands within the dispersion curves that correspond to pure out-of-plane modes or in-plane modes. If the plate is excited only out-of-plane, which is the case in the experiments described above, these branches (modes) are not excited and therefore would correspond to lower transmission regions within the FRF diagrams.

Phononic crystals and metamaterials have been used to manipulate waves in a wide frequency spectrum: from heat propagation at very high frequencies, ultrasonic waves at high frequencies, down to audible sound and earthquake excitations at low or very low frequencies. They generally consist of two- or three-dimensional unit cells arranged in periodic arrays. The advantage of designing building blocks in fundamentally discrete materials—like phononic materials—is the ability to engineer their dispersion relation. A common method to control the propagation or reflection of waves in dispersive systems is the opening of frequency band gaps, where waves ca not penetrate the material bulk. Moreover, these frequency bands can have unconventional characteristics, for example, directing radially emitted waves to propagate only along a line (wave beaming), or along the edges of a medium, without being susceptible to imperfections or back scattering (waves with topological protection).

Generally, opening a band gap can be accomplished utilizing three different physical phenomena: (i) Bragg scattering (BS), where a periodic medium can inhibit waves whose wavelength is on the order of the mediums' spatial periodicity (i.e., the Bragg limit) through destructive interferences. This is usually achieved by having two materials within the unit cell or a single material with holes. (ii) Local resonances (LR), where wave propagation can be restricted using an inherent resonance in the unit cell, decoupling the unit cell size from the wavelength of the attenuated waves and removing the periodicity requirement of the medium. (iii) Inertial amplification (IA), where a resonator is usually coupled to the unit cell in multiple locations. While this coupling is usually achieved with hinges and rigid connections, multiple connections and chirality are sufficient to observe inertial resonances. All these band gap opening mechanisms can be employed to engineer dispersion and manipulate elastic waves for a multitude of applications such as focusing, beaming or shielding and insulation.

Figure 34:
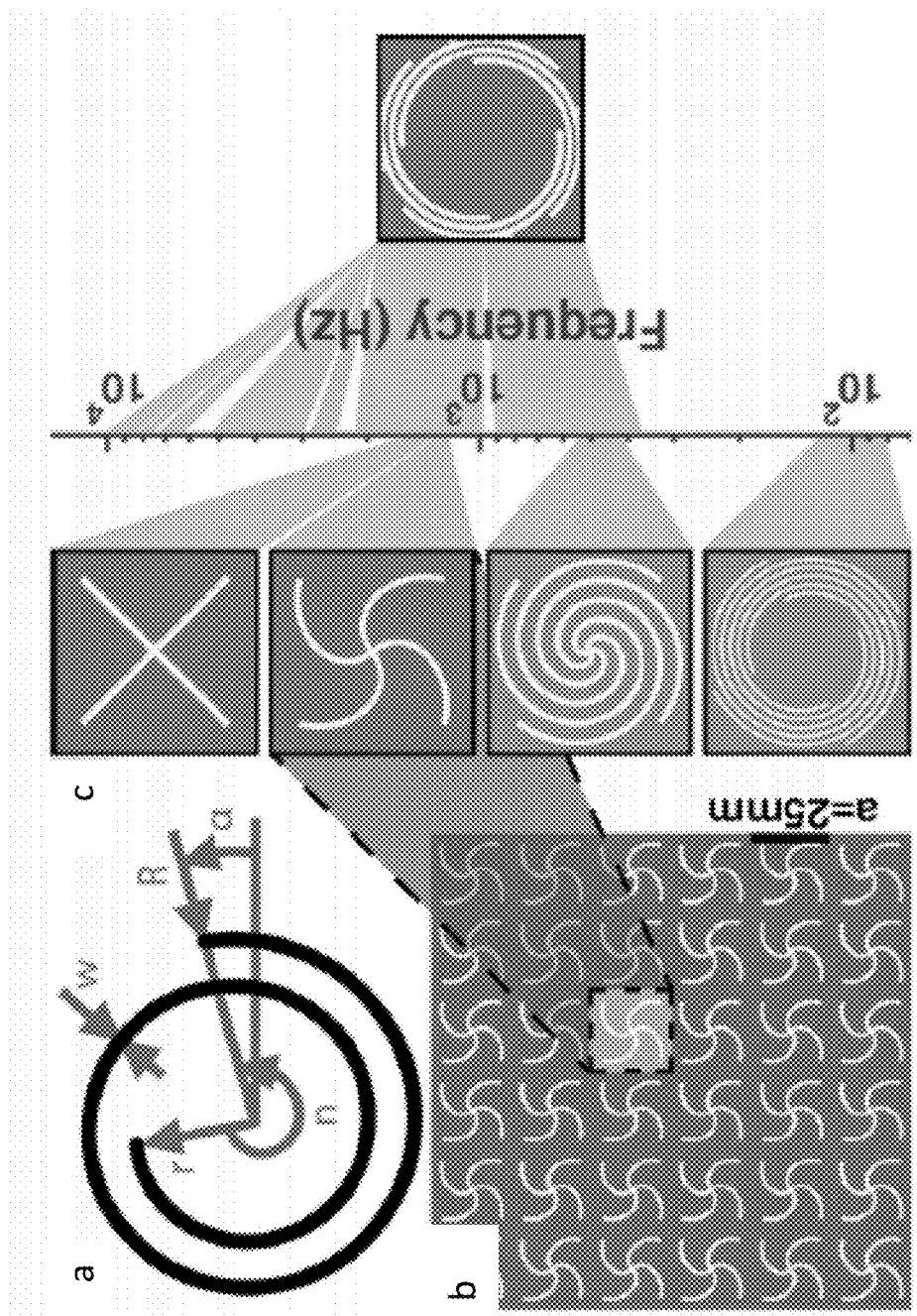
FIGS. 34-35 illustrate different exemplary spirals.

FIG. 34 illustrates exemplary patterns for spiral shapes to be used in different embodiments of the devices of the present disclosure. In particular, FIG. 34 illustrates spiral-based structured plates. Panel a illustrates a schematic of an Archimedean spiral with its parameters. Panel b illustrates a structured plate composed of a periodic array of spirals. White areas indicate the absence of material. Panel c illustrates varying spiral geometries with flexural band gaps. The band gaps span two decades of frequencies, while keeping constant the lattice size, $\alpha$=25 mm, thickness, th=3 mm, density $\rho$=1018 Kg/m$^3$, Young's Modulus E=2 GPa and Poisson's ratio=0.33.

Figure 35:
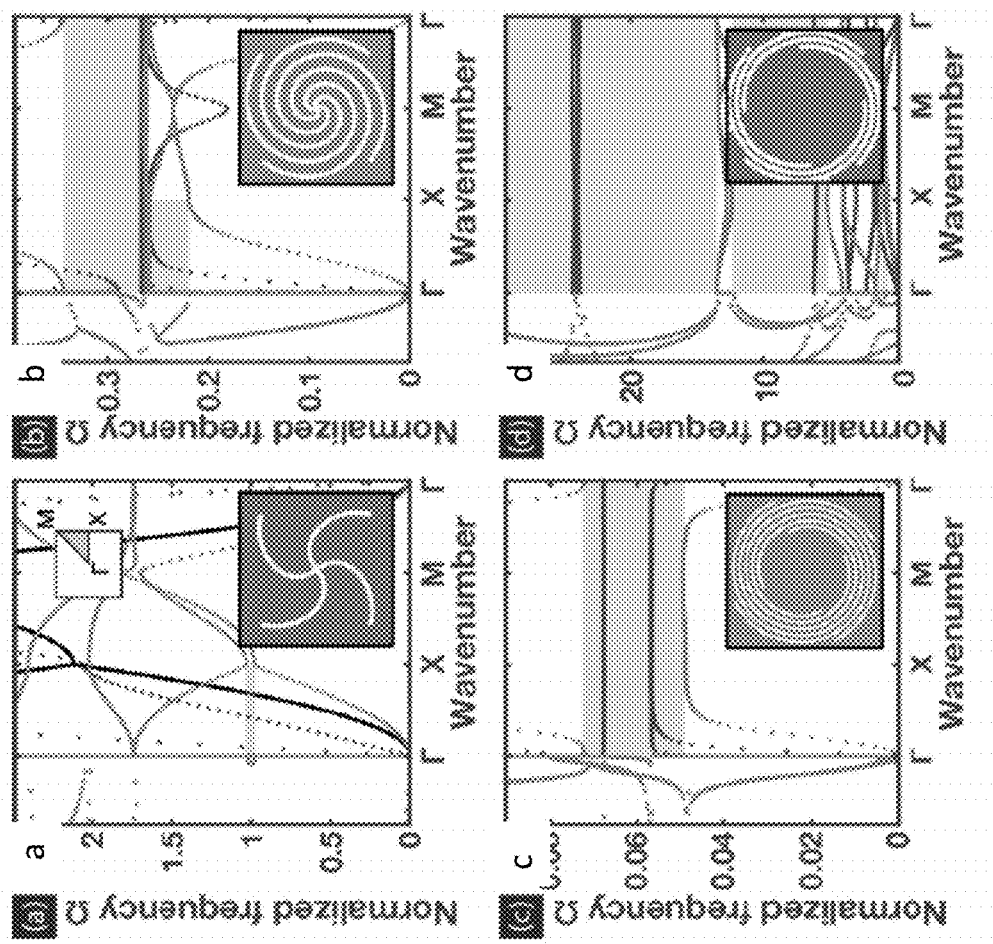

FIG. 35 illustrates exemplary band gap opening mechanisms. Non-dimensional dispersion curves with both the attenuated and propagating curves. The corresponding unit cells are also illustrated. Panel a illustrates Bragg scattering, with r=0 mm, n=0.25, R=12.8 mm, w=0.6 mm, and $\alpha$=45°; and the dispersion for flexural waves in the non-spiral material. Panel b illustrates local resonances, with r=0 mm, n=1.25, R=12.8 mm, w=0.6 mm, and $\alpha$=45°. Panel c illustrates inertial amplification, with r=6 mm, n=1.25, R=12.8 mm, w=0.6 mm, and $\alpha$=23°. Panel d illustrates Bragg scattering, with r=10 mm, n=0.65, R=13.25 mm, w=0.65 mm, and $\alpha$=37.7°.

Figure 36:
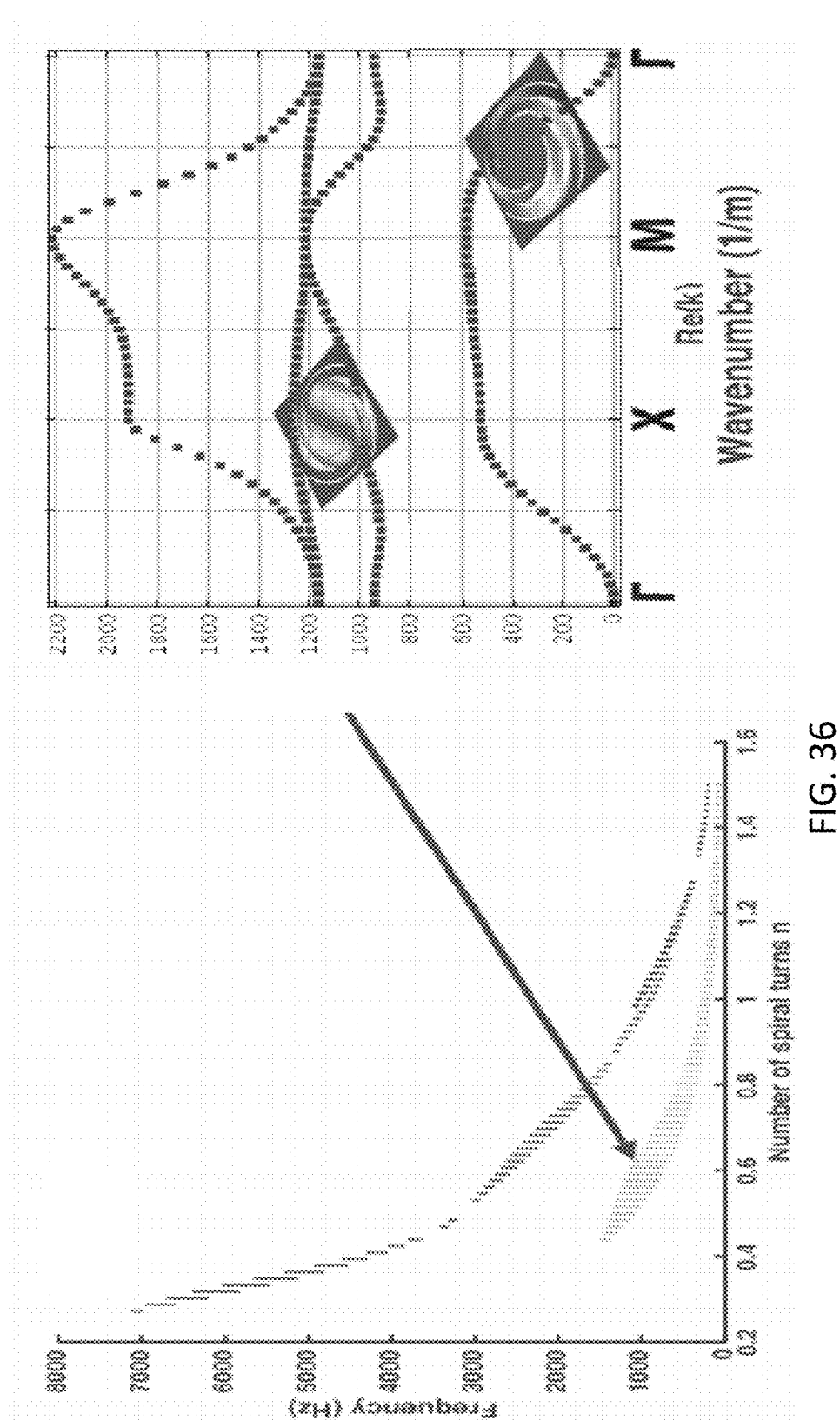
FIG. 36 illustrates frequency vs number of spiral turns.
Figure 37:
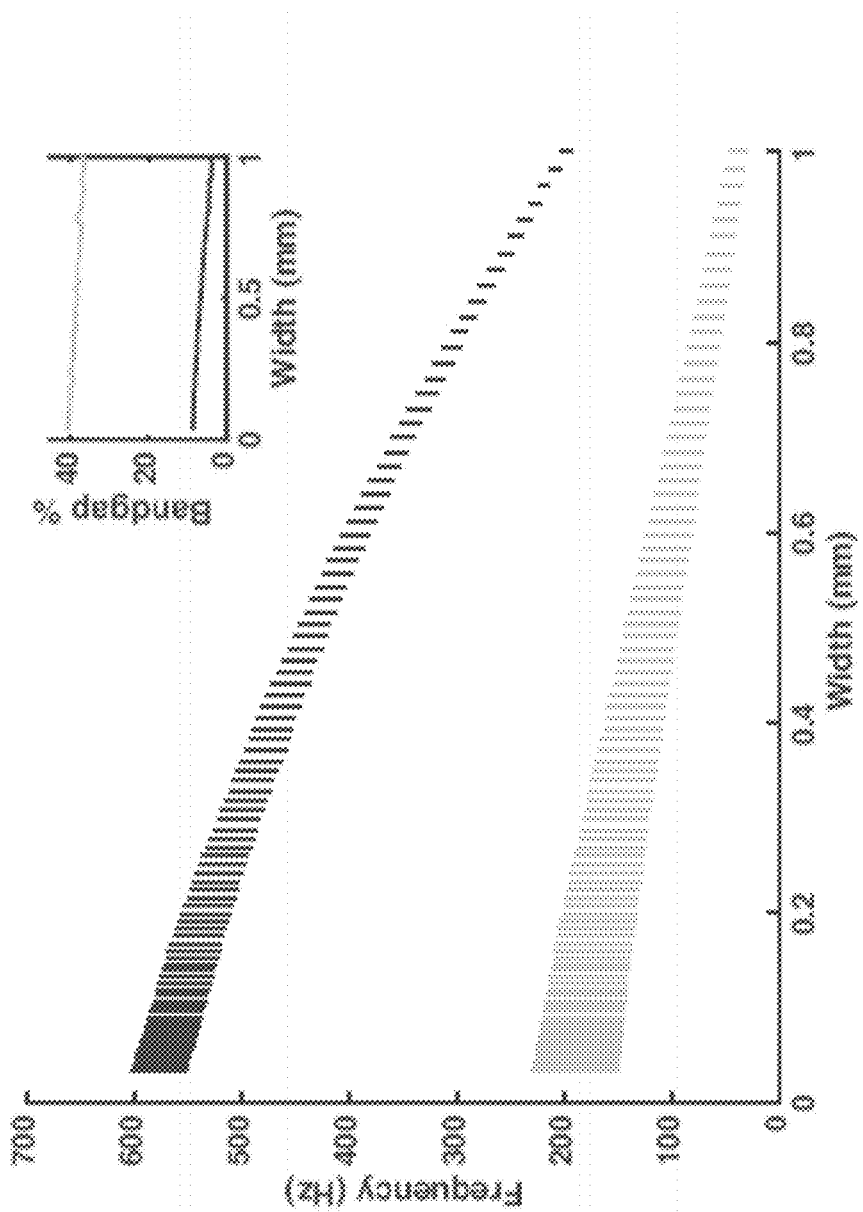
FIG. 37 illustrates frequency vs width of the spiral.

FIG. 36 illustrates the out of plane band gaps of the amplified unit cell as a function of the number of spiral turns, and the dispersion curve of the unit cell with the mode shapes of the edges of the band gaps. FIG. 37 illustrates the out of plane band gaps of the amplified unit cell as a function of the width of the spirals.

In some embodiments, the gate element comprises two flexible structures so that a magnetic force can switch the transistor ON or OFF. In some embodiments, more than two flexible structures may be used, to have multiple gates. In some embodiments, the gate may comprise a single flexible structure to turn the transistor either ON or OFF, while the transistor may comprise means for returning the state to its previous configuration, such as for example springs or other elastic means to apply a force. A magnetic force may counteract this elastic force while a force is applied to the magnetic gate.

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The references in the present application, shown in the reference list below, are incorporated herein by reference in their entirety.

REFERENCES

[1] Freeth T et al. (2006) Decoding the ancient greek astronomical calculator known as the antikythera mechanism. *Nature* 444(7119):587-591.
[2] Menabrea L (1842) Sketch of the analytical engine invented by charles babbage, with notes by the translator augusta ada king, countess of lovelace. *Taylors Scientific Memoirs* 3:666-731.
[3] Li B, Wang L, Casati G (2006) Negative differential thermal resistance and thermal transistor. *Applied Physics Letters* 88(14):143501.
[4] Wang L, Li B (2007) Thermal logic gates: computation with phonons. *Physical review letters* 99(17):177208.
[5] Joulain K, Drevillon J, Ezzahri Y, Ordonez-Miranda J (2016) Quantum thermal transistor. *Physical review letters* 116(20):200601.
[6] Bringuier S et al. (2011) Phase-controlling phononic crystals: Realization of acoustic boolean logic gates. *The Journal of the Acoustical Society of America* 130(4):1919-1925.
[7] Zhang T, Cheng Y, Guo Jz, Xu Jy, Liu Xj (2015) Acoustic logic gates and boolean operation based on self-collimating acoustic beams. *Applied Physics Letters* 106(11):113503.
[8] Li F, Anzel P, Yang J, Kevrekidis P G, Daraio C (2014) Granular acoustic switches and logic elements. *Nature communications* 5.
[9] Babaee S, Viard N, Wang P, Fang N X, Bertoldi K (2015) Harnessing deformation to switch on and off the propagation of sound. *Advanced Materials*.
[10] Liang B, Yuan B, Cheng Jc (2009) Acoustic diode: rectification of acoustic energy flux in one-dimensional systems. *Physical review letters* 103(10):104301.
[11] Liang B, Guo X, Tu J, Zhang D, Cheng J (2010) An acoustic rectifier. *Nature materials* 9(12):989-992.
[12] Popa B I, Cummer S A (2014) Non-reciprocal and highly nonlinear active acoustic metamaterials. *Nature communications* 5.
[13] Li X F et al. (2011) Tunable unidirectional sound propagation through a sonic-crystal-based acoustic diode. *Physical review letters* 106(8):084301.
[14] Devaux T, Tournat V, Richoux O, Pagneux V (2015) Asymmetric acoustic propagation of wave packets via the self-demodulation effect. *Physical review letters* 115(23):234301.
[15] Boechler N, Theocharis G, Daraio C (2011) Bifurcation-based acoustic switching and rectification. *Nature materials* 10(9):665-668.
[16] Vahala K et al. (2009) A phonon laser. *Nature Physics* 5(9):682-686.
[17] Jing H et al. (2014) Pt-symmetric phonon laser. *Physical review letters* 113(5):053604.
[18] Sklan S R (2015) Splash, pop, sizzle: Information processing with phononic computing. *AIP Advances* 5(5):053302.
[19] Ladd T D et al. (2010) Quantum computers. *Nature* 464(7285):45-53.
[20] El-Kady I (2015) Phonon-based scalable quantum computing and sensing (presentation video).
[21] Liang B, Kan Ww, Zou Xy, Yin Ll, Cheng Jc (2014) Acoustic transistor: Amplification and switch of sound by sound. *Applied Physics Letters* 105(8):083510.
[22] Malishava M, Khomeriki R (2015) All-phononic digital transistor on the basis of gap-soliton dynamics in an anharmonic oscillator ladder. *Physical review letters* 115(10):104301.
[23] Liu Z et al. (2000) Locally resonant sonic materials. *Science* 289(5485):1734-1736.
[24] Maldovan M (2013) Sound and heat revolutions in phononics. *Nature* 503(7475):209-217.
[25] Hussein M I, Leamy M J, Ruzzene M (2014) Dynamics of phononic materials and structures: Historical origins, recent progress, and future outlook. *Applied Mechanics Reviews* 66(4):040802.
[26] Cummer S A, Christensen J, Ala A (2016) Controlling sound with acoustic metamaterials. *Nature Reviews Materials* 1:16001.
[27] Mahboob I, Flurin E, Nishiguchi K, Fujiwara A, Yamaguchi H (2011) Interconnect-free parallel logic circuits in a single mechanical resonator. *Nature communications* 2:198.
[28] Hatanaka D, Mahboob I, Onomitsu K, Yamaguchi H (2013) A phonon transistor in an electromechanical resonator array. *Applied Physics Letters* 102(21):213102.
[29] Levitt, Malcolm H. Spin dynamics: basics of nuclear magnetic resonance. John Wiley & Sons, 2001.
[30] Bilal, Osama R. and Hussein, Mahmoud I., Trampoline metamaterial: Local resonance enhancement by springboards. *Applied Physics Letters* 103.11 (2013): 111901.
[31] Osama R. Bilal and Mahmoud I. Hussein, Ultrawide phononic band gap for combined in-plane and out-of-plane waves, *Phys. Rev. E.* (R) 84, 2011

What is claimed is:

1. A structure comprising:
a first substrate comprising a first plurality of magnets arranged in a first row, and a first gate magnet on a first lateral side of the first substrate;
a second substrate comprising a plurality of cantilevered elements and a second plurality of magnets, each cantilevered element of the plurality of cantilevered elements comprising a magnet of the second plurality of magnets and at least one cantilever, the plurality of cantilevered elements and the second plurality of magnets being arranged in a second row; and
a control element comprising a first flexible substrate and a second gate magnet attached to the at least one flexible substrate;
wherein:
the first flexible substrate of the control element is positioned so that the second gate magnet is in an offset position relative to the first gate magnet, upon transmission of a phonon to first flexible substrate of the control element, the first flexible substrate moves from the offset position to an aligned position aligning the second gate magnet to the first gate magnet, the aligned position of the first flexible substrate is configured so that a first repulsive magnetic force is applied between the second gate magnet and the first gate magnet, upon application of the first repulsive magnetic force, the first substrate shifts from a first position offset from the second substrate to a second position vertically aligned to the second substrate, the second position is configured so that a second repulsive magnetic force is applied between each magnet of the first plurality of magnets arranged in the first row, and each corresponding magnet of the second plurality of magnets arranged in the second row, and upon application of the second repulsive force, each cantilevered element of the plurality of cantilevered elements extends elastically upward from a flattened configuration.

2. The structure of claim 1, wherein:

the control element further comprises a second flexible substrate and a third gate magnet attached to the second flexible substrate, the first substrate further comprises a fourth gate magnet on a second lateral side of the first substrate, the second lateral side being opposite to the first lateral side, the second flexible substrate of the control element is positioned so that the third gate magnet is in an offset position relative to the fourth gate magnet, upon transmission of a phonon to the second flexible substrate of the control element, the second flexible substrate moves from an offset position to an aligned position aligning the third gate magnet to the fourth gate magnet, the aligned position of the second flexible substrate is configured so that a third repulsive magnetic force is applied between the third gate magnet and the fourth gate magnet, and upon application of the third repulsive magnetic force, the first substrate shifts from the second position vertically aligned to the second substrate to the first position offset from the second substrate, thereby removing the second repulsive force and allowing each cantilevered element of the plurality of cantilevered elements to return to the flattened configuration.

3. The structure of claim 1, wherein:

the second substrate comprises a source region and a drain region, the source region and the drain regions being located at opposite ends of the plurality of cantilevered elements arranged in the second row, and the second substrates and the plurality of cantilevered elements are configured to:

transmit phonons from the source region to the drain region when each cantilevered element of the plurality of cantilevered elements is extended elastically upward, and block transmission of phonons from the source region to the drain region when each cantilevered element of the plurality of cantilevered elements is in the flattened configuration.

4. The structure of claim 1, wherein each cantilevered element of the plurality of cantilevered elements comprises a plurality of cantilevers.

5. The structure of claim 4, wherein each cantilevered element of the plurality of cantilevered elements is shaped like a spiral.

6. The structure of claim 1, wherein each cantilevered element of the plurality of cantilevered elements comprises four cantilevers.

7. The structure of claim 6, wherein each cantilevered element of the plurality of cantilevered elements is shaped like a spiral, each spiral comprising four cantilevers connected at a central portion of the spiral.

8. The structure of claim 7, wherein each magnet of the second plurality of magnets is placed within a corresponding central portion of each spiral.

9. The structure of claim 8, wherein the spiral is an Archimedean spiral.

10. The structure of claim 1, wherein first substrate, the second substrate, and the first flexible substrate are made of a material selected from the group consisting of: medium density fiberboard, a metal, wood, and a polymer.

11. The structure of claim 1, wherein the first plurality of magnets and the second plurality of magnets are made of neodymium.

12. A system comprising a plurality of phononic transistors, each phononic transistor comprising the structure of claim 1, the plurality of phononic transistors configured to form at least one phononic logic gate.

13. The system of claim 12, wherein the at least one phononic logic gate comprises a plurality of phononic logic gates configured to form a half adder.

14. The system of claim 12, wherein the at least one phononic logic gate comprises a plurality of phononic logic gates configured to form a full adder.

* * * * *